(12) United States Patent
Ecton et al.

(10) Patent No.: US 12,543,578 B2
(45) Date of Patent: Feb. 3, 2026

(54) ELECTRONIC PACKAGING ARCHITECTURE WITH CUSTOMIZED VARIABLE METAL THICKNESS ON SAME BUILDUP LAYER

(71) Applicant: Intel Corporation, Santa Clara, CA (US)

(72) Inventors: Jeremy D. Ecton, Gilbert, AZ (US); Kristof Darmawikarta, Chandler, AZ (US); Suddhasattwa Nad, Chandler, AZ (US); Oscar Ojeda, Chandler, AZ (US); Bai Nie, Chandler, AZ (US); Brandon C. Marin, Gilbert, AZ (US); Gang Duan, Chandler, AZ (US); Jacob Vehonsky, Gilbert, AZ (US); Onur Ozkan, Scottsdale, AZ (US); Nicholas S. Haehn, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 986 days.

(21) Appl. No.: 17/482,852

(22) Filed: Sep. 23, 2021

(65) Prior Publication Data

US 2023/0087810 A1 Mar. 23, 2023

(51) Int. Cl.
*H01L 23/498* (2006.01)
*H01L 21/48* (2006.01)
*H01L 23/00* (2006.01)

(52) U.S. Cl.
CPC .... *H01L 23/49838* (2013.01); *H01L 21/4846* (2013.01); *H01L 21/4853* (2013.01); *H01L 23/49811* (2013.01); *H01L 24/06* (2013.01); *H01L 24/11* (2013.01); *H01L 24/14* (2013.01); *H01L 24/04* (2013.01); *H01L 24/05* (2013.01);
(Continued)

(58) Field of Classification Search
CPC .......... H01L 23/49838; H01L 21/4846; H01L 21/4853; H01L 23/49811; H01L 24/06; H01L 24/11; H01L 24/14; H01L 24/04; H01L 24/05; H01L 24/16; H01L 2224/0401; H01L 2224/05573; H01L 2224/05647; H01L 2224/05666; H01L 2224/06505; H01L 2224/11462; H01L 2224/11912; H01L 2224/13082; H01L 2224/13582; H01L 2224/1403;
(Continued)

(56) References Cited

U.S. PATENT DOCUMENTS 7,456,030 B1 11/2008 Hopper
2012/0032320 A1 2/2012 Chao
(Continued)

OTHER PUBLICATIONS

Partial Search Report from European Patent Application No. 22183759.4, mailed Dec. 15, 2022, 11 pgs.
(Continued)

*Primary Examiner* — Robert G Bachner
(74) *Attorney, Agent, or Firm* — Schwabe, Williamson & Wyatt P.C.

(57) ABSTRACT

Embodiments disclosed herein include electronic packages and methods of forming such electronic packages. In an embodiment, an electronic package comprises a plurality of stacked layers. In an embodiment, a first trace is on a first layer, wherein the first trace has a first thickness. In an embodiment, a second trace is on the first layer, wherein the second trace has a second thickness that is greater than the first thickness. In an embodiment, a second layer is over the first trace and the second trace.

18 Claims, 18 Drawing Sheets

(52) U.S. Cl.
CPC ...... *H01L 24/16* (2013.01); *H01L 2224/0401* (2013.01); *H01L 2224/05573* (2013.01); *H01L 2224/05647* (2013.01); *H01L 2224/05666* (2013.01); *H01L 2224/06505* (2013.01); *H01L 2224/11462* (2013.01); *H01L 2224/11912* (2013.01); *H01L 2224/13082* (2013.01); *H01L 2224/13582* (2013.01); *H01L 2224/1403* (2013.01); *H01L 2224/16227* (2013.01)

(58) Field of Classification Search
CPC ......... H01L 2224/16227; H01L 23/538; H01L 23/49822
See application file for complete search history.

(56) References Cited

U.S. PATENT DOCUMENTS

| | | |
|---|---|---|
| 2020/0205279 A1 | 6/2020 | Ecton |
| 2020/0253037 A1 | 8/2020 | Marin |
| 2021/0159174 A1 | 5/2021 | Lee |

OTHER PUBLICATIONS

Search Report from European Patent Application No. 22183759.4, mailed Feb. 10, 2023, 12 pgs.

ELECTRONIC PACKAGING ARCHITECTURE WITH CUSTOMIZED VARIABLE METAL THICKNESS ON SAME BUILDUP LAYER

TECHNICAL FIELD

Embodiments of the present disclosure relate to electronic packages, and more particularly to electronic packages with non-uniform metal thicknesses on a single buildup layer.

BACKGROUND

In order to provide improved power delivery performance, it may be necessary to make power delivery traces thicker than signaling traces. That is, within a single layer of an electronic package, traces with different thicknesses may be desired. Currently, such dual thickness traces can be manufactured with a double patterning process. A first lithography step forms the thin features, and a second lithography step is used to form the thicker features. This approach accrues extra misalignment due to the two lithography operations, Additionally, the cross-section of the thicker features generally has a domed shape.

In addition to the need for dual metal thicknesses within the buildup layers of an electronic package substrate, it is also desirable to have non-uniform thicknesses on the first level interconnects (FLIs) for various reasons. Particularly, the variations in solder resist opening pad size results in bump height variations. That is, small solder resist opening pads may have less solder than the larger solder resist opening pad sizes. The difference in solder volume can result in bump height variations. FLI pad thickness variation can be used to correct the bump height variation.

EMBODIMENTS OF THE PRESENT DISCLOSURE

Described herein are electronic packages with non-uniform metal thicknesses on a single buildup layer, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
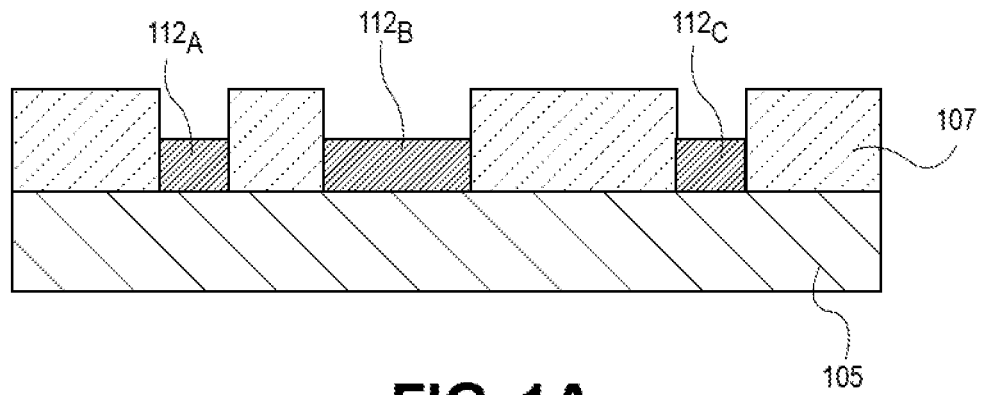
FIGS. 1A-1C are cross-sectional illustrations of a method for forming traces with a non-uniform thickness.
Figure 1B:
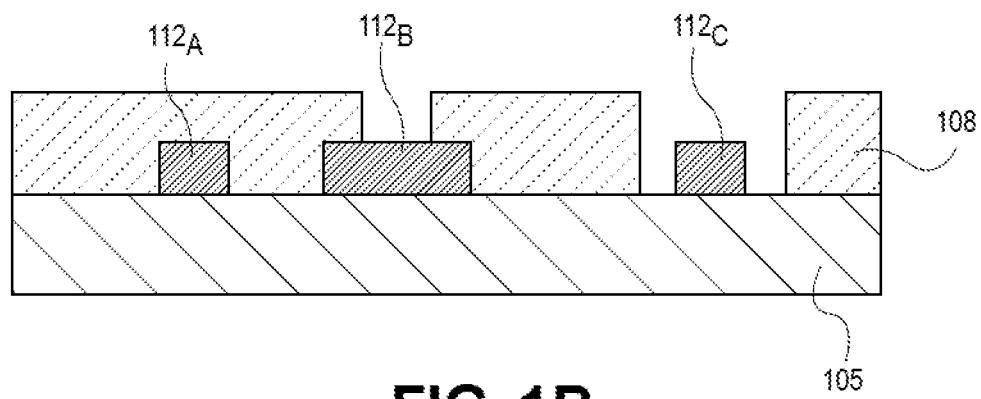
Figure 1C:
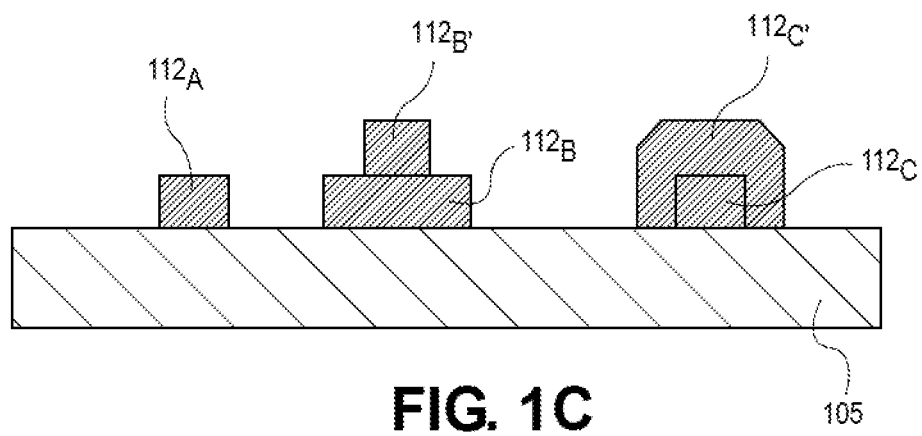

As noted above, variable thickness traces within a layer of a package substrate may enable improvements in power delivery performance. For example, power delivery traces can be thicker than signaling traces in order to reduce the resistance of the power delivery traces. FIGS. 1A-1C are cross-sectional illustrations of an existing process for forming variable thickness traces within a layer. As shown in FIG. 1A, a set of traces $112_A$-$112_C$ are provided over a buildup layer 105 within a first resist 107. The first resist 107 is patterned with a first lithography process in order to make the traces $112_A$-$112_C$. After the first lithography process, the first resist 107 is stripped, and a second resist 108 is deposited over the traces $112_A$-$112_C$. As shown in FIG. 1B, second openings are formed over the trace $112_B$ and the trace $112_C$. The first trace $112_A$ is covered since it will not be increased in thickness. In an embodiment, the opening over the trace $112_B$ is to provide a via to the trace $112_B$. The opening over the trace $112_C$ is wider than the trace $112_C$. Accordingly, a wide thick trace can be formed. As shown in FIG. 1C, a via $112_B'$ is over the trace $112_B$, and a trace $112_C'$ is provided over trace $112_C$.

Double patterning processes, such as the one shown in FIGS. 1A-1C have significant drawbacks. One issues is that electrolytic plating of low copper density regions, as is the case with the second plating operation, is not trivial. Particularly, such plating processes will likely result in a large copper thickness variation that will be detrimental to the planarization process. Additionally, extra misalignment is created due to the two lithography operations, the first to define the thin trace and the second to define the thick trace. This results in a larger spacing rule between the thick and thin features. Accordingly, there is a waste of valuable real estate that may not be available in certain product designs. In some instances, the double patterning process also results in a trace $112_C$ and $112_C'$ that has a domed shaped cross-section. That is, a rectangular cross-section may not be possible in some plating processes.

Accordingly, embodiments disclosed herein include a process for forming non-uniform trace thicknesses using a single patterning process. In an embodiment, a thick pattern and a thin pattern within the same metallization layer can be created by incorporating regions of different metal seed types with varying electrical resistance within the lithography pattern. This can be achieved by depositing multiple seed layers. A lithography pattern can then be followed by either a laser ablation operation to selectively remove the top most seed layer, or a lithography defined wet seed etch operation to selectively remove the top most seed layer. This results in the formation of regions of differing electrical resistance within the lithography pattern. Regions of high resistance form a thin feature during plating, and regions of low resistance form a thick pattern during plating. In a particular embodiment, a titanium seed layer is formed first, and then a copper seed layer is formed over the titanium seed layer. Selected locations where thin features are desired are then stripped of the copper seed layer to expose the higher resistance titanium seed layer. A copper plating operation then is able to form thin features over the titanium seed layer and thick features over the copper seed layer. In some embodiments, the thicknesses of the titanium seed layer and the copper seed layer may also be modified in order to alter the resistivity of the seed layers. This can also be used to modify the resulting thicknesses of the plated features.

Since both the thick and thin pattern are defined by a single lithography operation (and a laser ablation operation in some embodiments), no adjustment in thick to thin shape spacing is required and the same design rules can be maintained. That is, the spacing between features does not need to be increased. Additionally, for the proposed process, the plating step is completed without masking part of the unit, as is the case with the process shown in FIGS. 1A-1C. As such, the copper density across the entire pattern remains more consistent since there is no areas of low copper density (e.g., 0% copper density) that are next to areas of high copper density. Therefore, the proposed approach is at a much lower risk for plating height variability than previous solutions. Furthermore, embodiments disclosed herein include a thick layer that maintains a rectangular cross-section, as opposed to the dome shaped cross-section described above. Thus, a larger cross-sectional area of copper is possible, which results in an improvement in the power delivery performance.

Figure 2A:
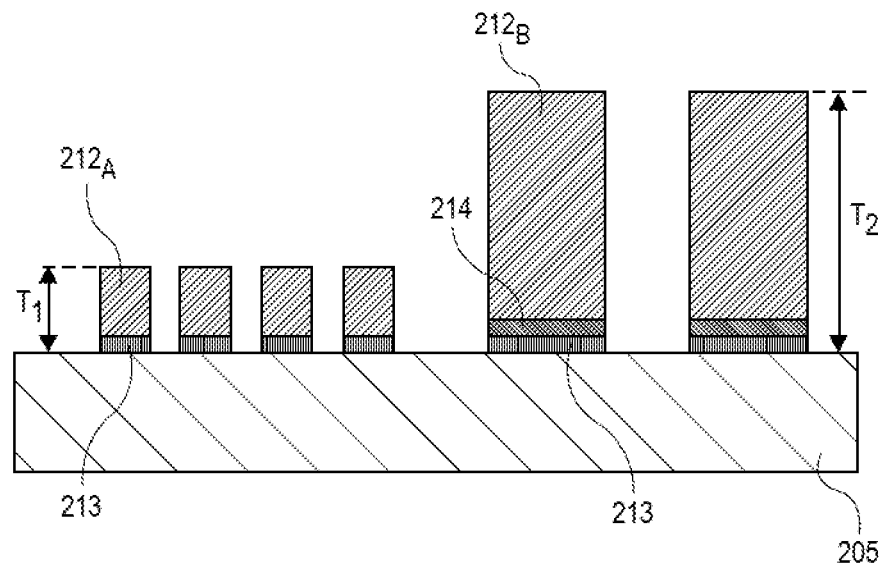
FIG. 2A is a cross-sectional illustration of a package substrate with first traces with a first thickness and second traces with a second thickness, in accordance with an embodiment.

Referring now to FIG. 2A, a cross-sectional illustration of a metallization layer is shown, in accordance with an embodiment. In an embodiment, the metallization layer may comprise a buildup layer 205. The buildup layer 205 may be a dielectric layer typical of electronic packaging substrates. Conductive features and the like may be provided in the buildup layer 205, and one or more additional buildup layers may be provided below the buildup layer 205. In some embodiments, a package core may be provided below the buildup layer 205.

In an embodiment, first traces $212_A$ and second traces $212_B$ may be provided over the buildup layer 205. In an embodiment, the first traces $212_A$ may have a first thickness $T_1$, and the second traces $212_B$ may have a second thickness $T_2$. The second thickness $T_2$ may be greater than the first thickness $T_1$. In a particular embodiment, the second thickness $T_2$ may be at least twice as large as the first thickness $T_1$. In an embodiment, the first traces $212_A$ may be formed over a first seed layer 213, and the second traces $212_B$ may be formed over the first seed layer 213 and a second seed layer 214. In an embodiment, the first seed layer 213 may have a first resistivity, and the second seed layer 214 may have a second resistivity, where the second resistivity is lower than the first resistivity. For example, the first seed layer 213 may comprise titanium, and the second seed layer 214 may comprise copper. More generally, the first seed layer 213 and the second seed layer 214 may include any pair of conductive materials with different resistivities. For example, some conductive material that may be used for the first seed layer 213 and the second seed layer 214 may include titanium, copper, ruthenium, nickel, gold, iron, tin, and the like.

Due to the differences in resistivity, less material will plate over the first seed layer 213 compared to the amount of material that will plate over the second seed layer 214. Accordingly, the first traces $212_A$ have a smaller thickness $T_1$ than the thickness $T_2$ of the second traces $212_B$. In addition to the differences in the resistivity of the materials for the first seed layer 213 and the second seed layer 214, layer thicknesses may be changed to fine tune the difference between the first thickness $T_1$ and the second thickness $T_2$. For example, increasing the thickness of the second seed layer 214 may further reduce the resistance of the second seed layer 214, and lead to an even larger second thickness $T_2$.

In an embodiment, an additional buildup layer (not shown) may be disposed over and around the first traces $212_A$ and the second traces $212_B$. While not bound to any particular purpose, it is to be appreciated that the increased thickness of the second traces $212_B$ may be particularly beneficial for use as power delivery traces. The larger thickness $T_2$ allows for a reduction in the resistance of the second traces $212_B$, which provides improvements in power delivery performance.

Figure 2B:
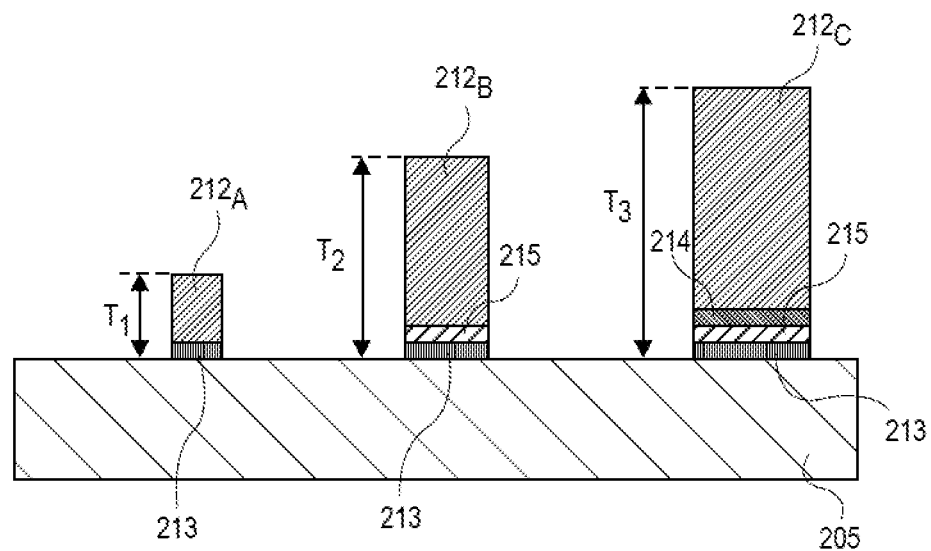
FIG. 2B is a cross-sectional illustration of a package substrate with a first trace with a first thickness, a second trace with a second thickness, and a third trace with a third thickness, in accordance with an embodiment.

Referring now to FIG. 2B, a cross-sectional illustration of a metallization layer is shown, in accordance with an additional embodiment. In FIG. 2B, a plurality of traces $212_A$-$212_C$ are shown. In an embodiment, each of the traces $212_A$-$212_C$ may have a different thicknesses, For example, trace $212_A$ may have a first thickness $T_1$, trace $212_B$ may have a second thickness $T_2$ that is greater than the first thickness $T_1$, and trace $212_C$ may have a third thickness $T_3$ that is greater than the second thickness $T_2$. While three traces 212 with different thicknesses are shown, it is to be appreciated that any number of different thicknesses may be included.

The different thicknesses are the result of having a plurality of different seed layers with different resistivities. For example, three seed layers are used to form the traces 212 with three different thicknesses $T_1$-$T_3$. As shown, a first seed layer 213 is provided under the first trace $212_A$. The first seed layer 213 may have the highest resistivity. As such, the first trace $212_A$ has the smallest thickness $T_1$. A second seed layer 215 and the first seed layer 213 may be provided below the second trace $212_B$. The second seed layer 215 may have a resistivity that is lower than the resistivity of the first seed layer 213. As such, the second thickness $T_2$ is greater than the first thickness $T_1$. In an embodiment, a third seed layer 214, the second seed layer 215, and the first seed layer 213 may be provided under the third trace $212_C$. In an embodiment, the third seed layer 214 may have a resistivity that is lower than the resistivity of the second seed layer 215. As such, the third thickness $T_3$ is greater than the second thickness $T_2$.

It is to be appreciated that three different trace thicknesses are shown in FIG. 2B. However, more than three different trace thicknesses may also be used in embodiments disclosed herein. Particularly, increasing the number of seed layers allows for an increase in the number of traces with different thicknesses. For example, when four seed layers with different resistivities are used, there can be traces with four different thicknesses.

Referring now to FIGS. 3A-3G, a series of cross-sectional illustrations depicting a process for forming a metallization layer in a package substrate is shown, in accordance with an embodiment. As shown, the metallization layer may be substantially similar to the metallization layer shown in FIG. 2A. In other embodiments, additional seed layers may be used to provide a metallization layer similar to the metallization layer shown in FIG. 2B or with any other number of trace thicknesses.

Figure 3A:
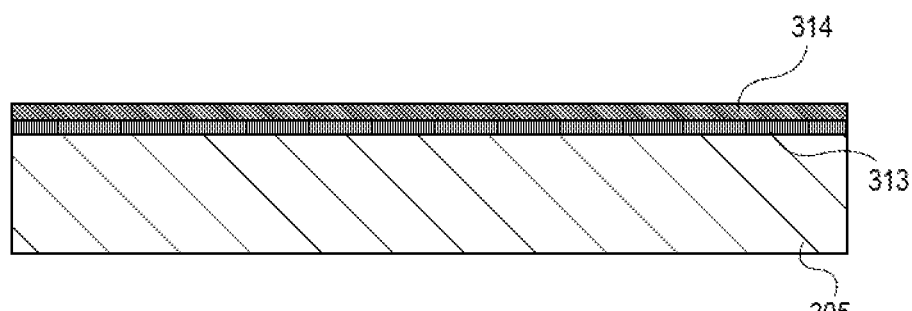
FIGS. 3A-3G are cross-sectional illustrations depicting a process for forming traces with non-uniform thicknesses, in accordance with an embodiment.

Referring now to FIG. 3A, a cross-sectional illustration of a buildup layer 305 is shown, in accordance with an embodiment. In an embodiment, the buildup layer 305 may be one layer in a plurality of buildup layers that are laminated to form a package substrate. In an embodiment, underlying layers are omitted for simplicity. But it is to be appreciated that conductive routing and the like may be included in the buildup layer 305 and in any underlying layers.

In an embodiment, a first seed layer 313 is provided over the buildup layer 305. The first seed layer 313 may have a first resistivity. In an embodiment, a second seed layer 314 is disposed over the first seed layer 313. The second seed layer 314 may have a second resistivity. In an embodiment, the second resistivity is lower than the first resistivity. For example, the first seed layer 313 may comprise titanium, and the second seed layer 314 may comprise copper. In an embodiment, the first seed layer 313 and the second seed layer 314 may each have substantially the same thickness. In other embodiments, the thicknesses of the first seed layer 313 and the second seed layer 314 may be different.

Figure 3B:
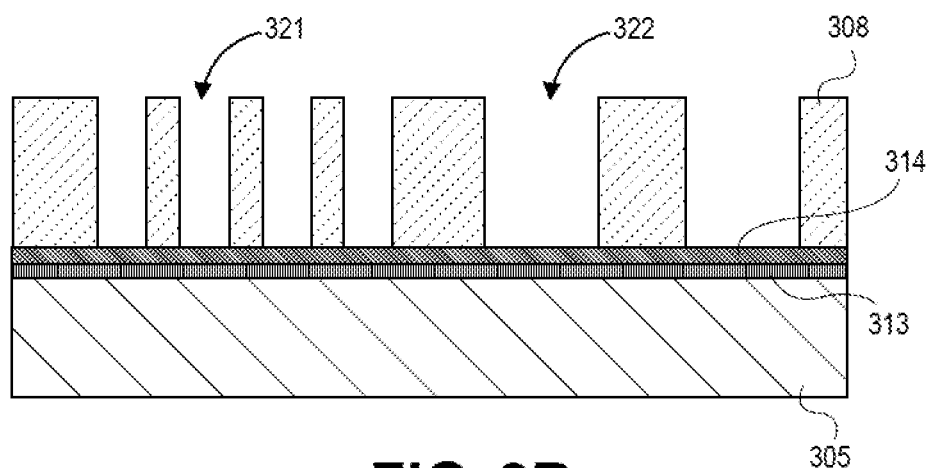

Referring now to FIG. 3B, a cross-sectional illustration after a resist layer 308 is disposed over the seed layers 313 and 314 is shown, in accordance with an embodiment. In an embodiment, the resist layer 308 is patterned to form openings 321 and 322. The openings 321 and 322 may be formed by exposing the resist layer 308 with actinic radiation, and developing the resist layer 308. It is to be appreciated that a single patterning operation is needed to form both the openings 321 and 322. As such, there is no alignment concerns between the openings 321 and 322, as is the case when a double patterning process is used, as described above. In an embodiment, the openings 321 have a first width and the openings 322 have a second width that is larger than the first width. In other embodiments, the openings 321 and 322 may be substantially uniform in width.

Figure 3C:
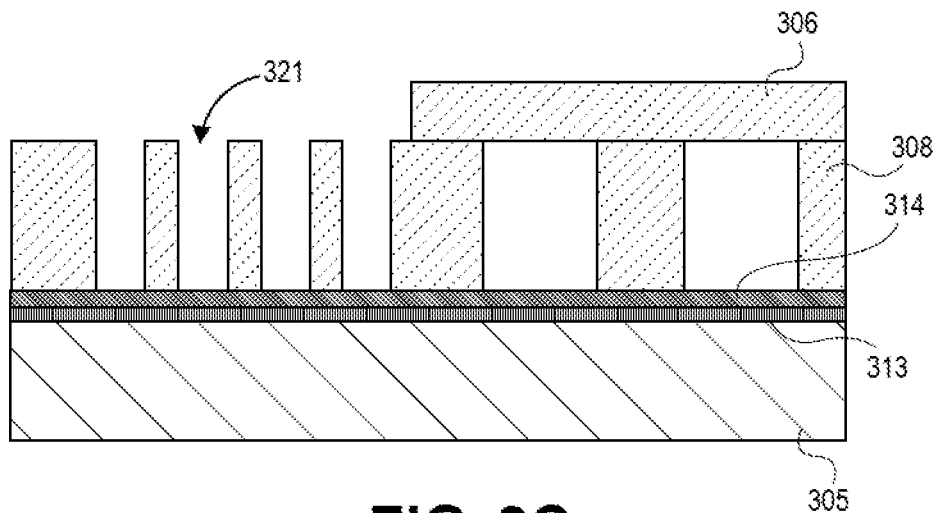

Referring now to FIG. 3C, a cross-sectional illustration of the structure after a second resist 306 is disposed over the resist layer 308. In an embodiment, the second resist 306 may be provided above the openings 322. It is to be appreciated that the patterning of the resist layer 306 does not impact alignment of the underlying features. Instead the resist layer 306 merely blocks out existing features. That is, the resist layer 306 does not play any role in the alignment between the openings 322 and the openings 321.

Figure 3D:
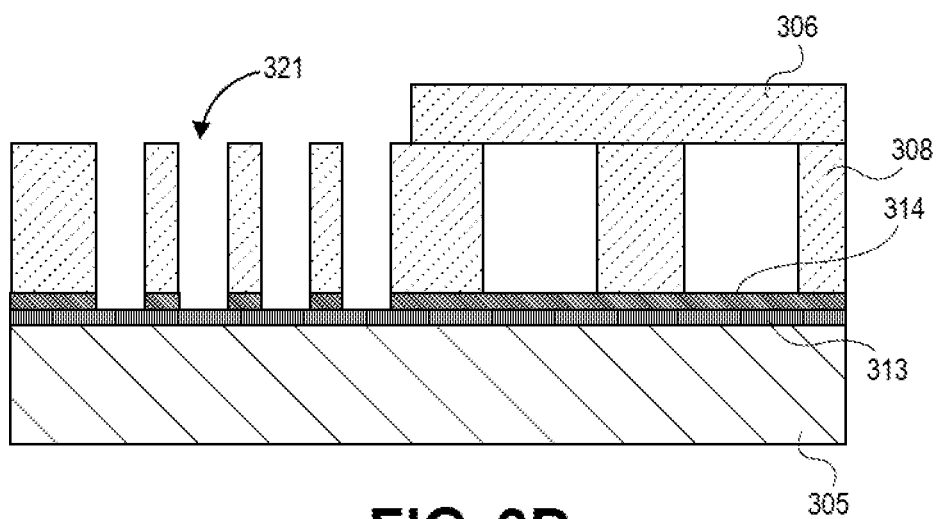

Referring now to FIG. 3D, a cross-sectional illustration of the structure after the second seed layer 314 is etched is shown, in accordance with an embodiment. As shown, the portion of the second seed layer 314 at the bottom of the openings 321 may be removed. For example, a wet etching process may be used to selectively etch the second seed layer 314. The second seed layer 314 under the openings 322 is protected from the etchant by the resist layer 306. The resulting structure includes first openings 321 that have the first seed layer 313 exposed. That is, the exposed seed layer in the first openings 321 is the first seed layer 313, and the exposed seed layer in the second openings 322 is the second seed layer 314. Due to the different resistivities of the first seed layer 313 and the second seed layer 314, the plating thickness will be different.

Figure 3E:
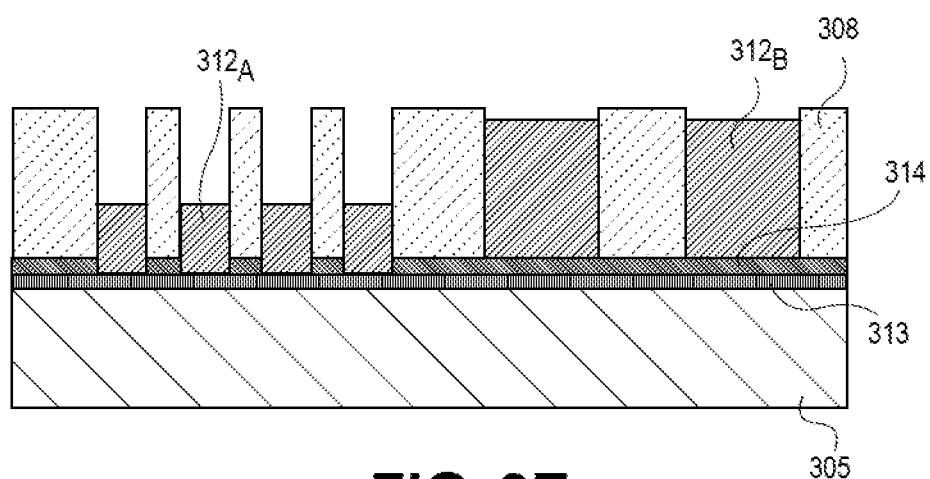

Referring now to FIG. 3E, a cross-sectional illustration of the structure after first traces $312_A$ and second traces $312_B$ are plated is shown, in accordance with an embodiment. In an embodiment, the first traces $312_A$ and the second traces $312_B$ are plated with the same plating process. However, the difference in the thicknesses of the first traces $312_A$ and the second traces $312_B$ is provided due to the difference in the resistivities of the first seed layer 313 and the second seed layer 314. In addition to plating thicker second traces $312_B$, it is to be appreciated that the thicker second traces $312_B$ maintain a substantially rectangular cross-section. The rectangular cross-section increases the volume of copper, compared to a domed structure, as shown in FIG. 1C. As such, power delivery performance is improved.

Figure 3F:
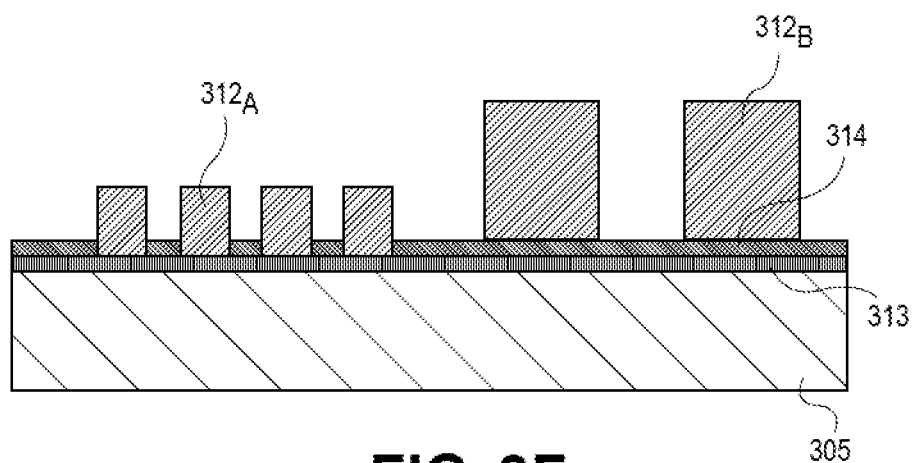

Referring now to FIG. 3F, a cross-sectional illustration of the structure after the resist 308 is stripped is shown, in accordance with an embodiment. In an embodiment, the resist 308 may be removed with an ashing process, or any other suitable stripping process. The resulting structure includes first traces $312_A$ and second traces $312_B$. At this point in the process flow, the portions of the seed layers 313 and 314 that were below the resist 308 remain. That is, at this point, the first traces $312_A$ are still electrically coupled to the second traces $312_B$.

Figure 3G:
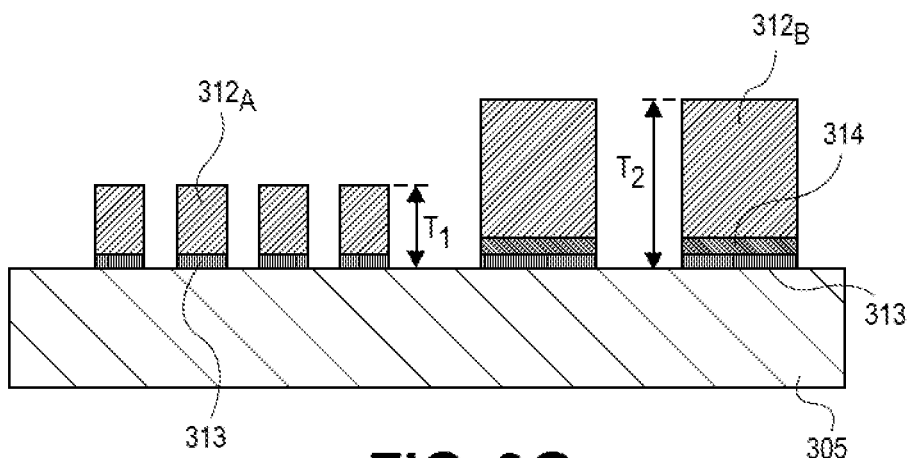

Referring now to FIG. 3G, a cross-sectional illustration of the structure after the seed layers are etched is shown, in accordance with an embodiment. In an embodiment, the second seed layer 314 and the first seed layer 313 may be etched with a flash etching process. In some embodiments, a first etching chemistry may be used to etch the second seed layer 314, and a second etching chemistry may be used to etch the first seed layer 313. At this point, each of the first traces $312_A$ and each of the second traces $312_B$ are electrically isolated from each other. As shown, the first traces $312_A$ are over only the first seed layer 313, and the second traces $312_B$ are over the first seed layer 313 and the second seed layer 314. The first traces $312_A$ may have a first thickness $T_1$, and the second traces $312_B$ may have a second thickness $T_2$ that is greater than the first thickness $T_1$. After the isolation of the first traces $312_A$ and the second traces $312_B$, a second dielectric layer (not shown) may be laminated over the first traces $312_A$ and the second traces $312_B$.

Referring now to FIGS. 4A-4F, a series of cross-sectional illustrations depicting a process for forming a metallization layer in a package substrate is shown, in accordance with an embodiment. As shown, the metallization layer may be substantially similar to the metallization layer shown in FIG. 2A. In other embodiments, additional seed layers may be used to provide a metallization layer similar to the metallization layer shown in FIG. 2B or with any other number of trace thicknesses.

Figure 4A:
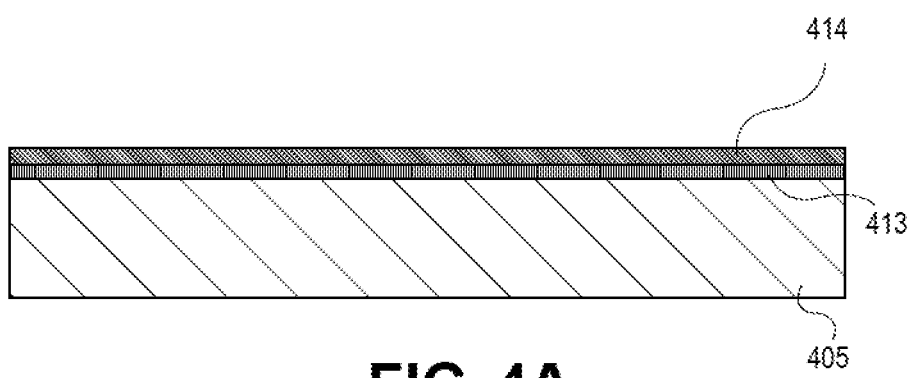
FIGS. 4A-4F are cross-sectional illustrations depicting a process for forming traces with non-uniform thicknesses, in accordance with an embodiment.

Referring now to FIG. 4A, a cross-sectional illustration of a buildup layer 405 is shown, in accordance with an embodiment. In an embodiment, the buildup layer 405 may be one layer in a plurality of buildup layers that are laminated to form a package substrate. In an embodiment, underlying layers are omitted for simplicity. But it is to be appreciated that conductive routing and the like may be included in the buildup layer 405 and in any underlying layers.

In an embodiment, a first seed layer 413 is provided over the buildup layer 405. The first seed layer 413 may have a first resistivity. In an embodiment, a second seed layer 414 is disposed over the first seed layer 413. The second seed layer 414 may have a second resistivity. In an embodiment, the second resistivity is lower than the first resistivity. For example, the first seed layer 413 may comprise titanium, and the second seed layer 414 may comprise copper. In an embodiment, the first seed layer 413 and the second seed layer 414 may each have substantially the same thickness. In other embodiments, the thicknesses of the first seed layer 413 and the second seed layer 414 may be different.

Figure 4B:
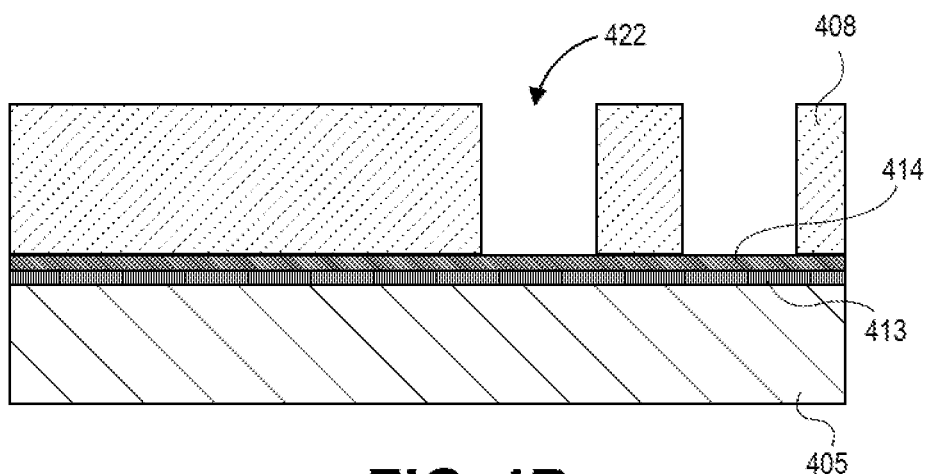

Referring now to FIG. 4B, a cross-sectional illustration after a resist layer 408 is disposed over the seed layers 413 and 414 is shown, in accordance with an embodiment. In an embodiment, the resist layer 408 is patterned to form openings 422. The openings 422 may be formed by exposing the resist layer 408 with actinic radiation, and developing the resist layer 408. As shown, openings 422 for the larger second traces are formed with a lithography patterning process, and the openings for the smaller first traces are formed in a subsequent processing operation.

Figure 4C:
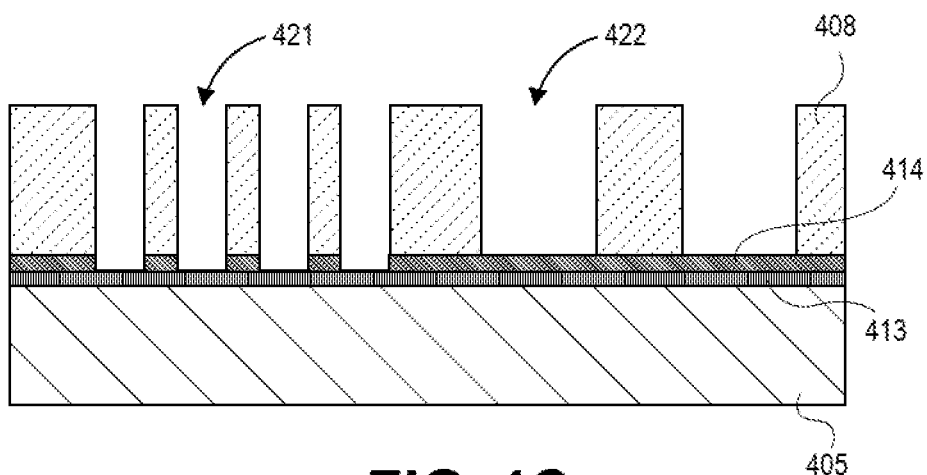

Referring now to FIG. 4C, a cross-sectional illustration after openings 421 are formed through the resist layer 408 is shown, in accordance with an embodiment. In an embodiment, the openings 421 may be formed with a laser ablation process. In addition to ablating the resist layer 408, the laser may also be used to ablate the second seed layer 414. As such, the first seed layer 413 is exposed. An embodiment, such as the one shown in FIG. 4C, allows for the removal of the second seed layer 414 without the need for an additional resist layer, as is the case in the process described above with respect to FIGS. 3A-3G.

Figure 4D:
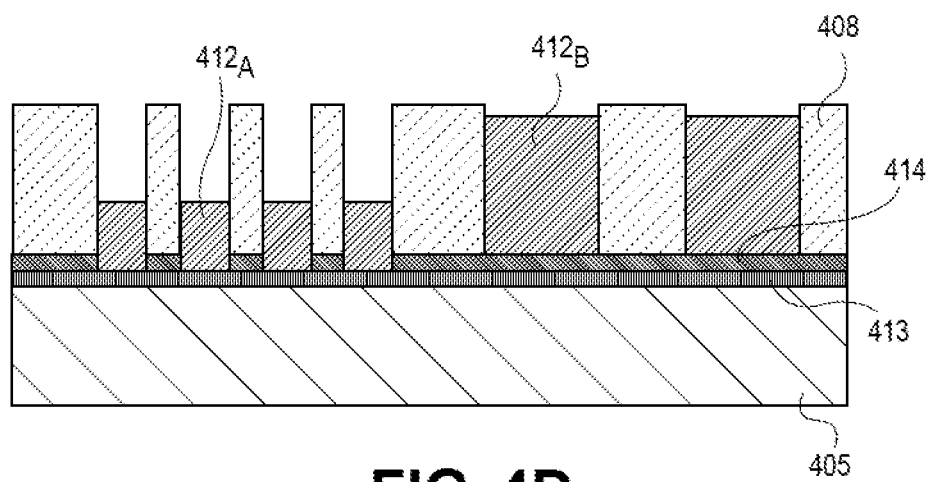

Referring now to FIG. 4D, a cross-sectional illustration of the structure after first traces $412_A$ and second traces $412_B$ are plated is shown, in accordance with an embodiment. In an embodiment, the first traces $412_A$ and the second traces $412_B$ are plated with the same plating process. However, the difference in the thicknesses of the first traces $412_A$ and the second traces $412_B$ is provided due to the difference in the resistivities of the first seed layer 413 and the second seed layer 414. In addition to plating thicker second traces $412_B$, it is to be appreciated that the thicker second traces $412_B$ maintain a substantially rectangular cross-section. The rectangular cross-section increases the volume of copper, compared to a domed structure, as shown in FIG. 1C. As such, power delivery performance is improved.

Figure 4E:
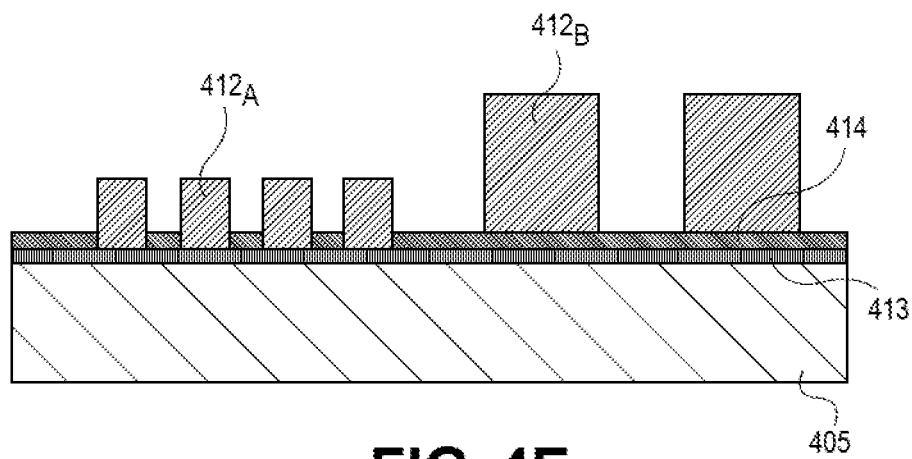

Referring now to FIG. 4E, a cross-sectional illustration of the structure after the resist 408 is stripped is shown, in accordance with an embodiment. In an embodiment, the resist 408 may be removed with an ashing process, or any other suitable stripping process. The resulting structure includes first traces $412_A$ and second traces $412_B$. At this point in the process flow, the portions of the seed layers 413 and 414 that were below the resist 408 remain. That is, at this point, the first traces $412_A$ are still electrically coupled to the second traces $412_B$.

Figure 4F:
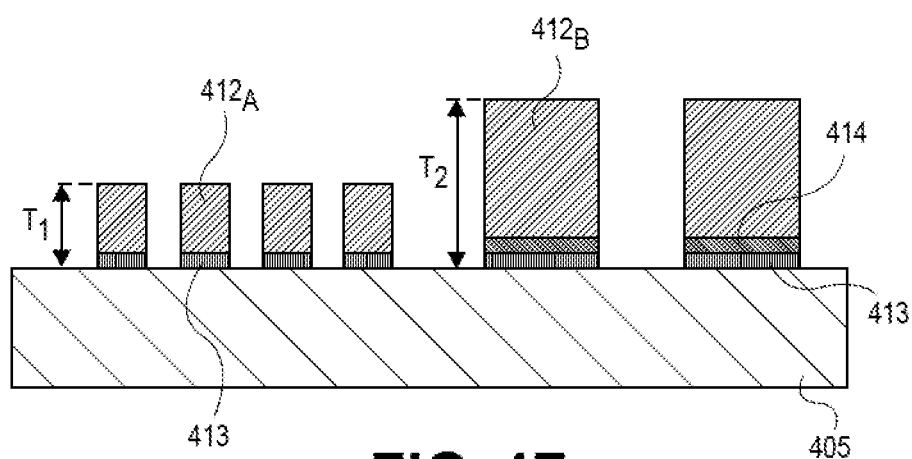

Referring now to FIG. 4F, a cross-sectional illustration of the structure after the seed layers are etched is shown, in accordance with an embodiment. In an embodiment, the second seed layer 414 and the first seed layer 413 may be etched with a flash etching process. In some embodiments, a first etching chemistry may be used to etch the second seed layer 414, and a second etching chemistry may be used to etch the first seed layer 413. At this point, each of the first traces $412_A$ and each of the second traces $412_B$ are electrically isolated from each other. As shown, the first traces $412_A$ are over only the first seed layer 413, and the second traces $412_B$ are over the first seed layer 413 and the second seed layer 414. The first traces $412_A$ may have a first thickness $T_1$, and the second traces $412_B$ may have a second thickness $T_2$ that is greater than the first thickness $T_1$. After the isolation of the first traces $412_A$ and the second traces $412_B$, a second dielectric layer (not shown) may be laminated over the first traces $412_A$ and the second traces $412_B$.

Figure 5:
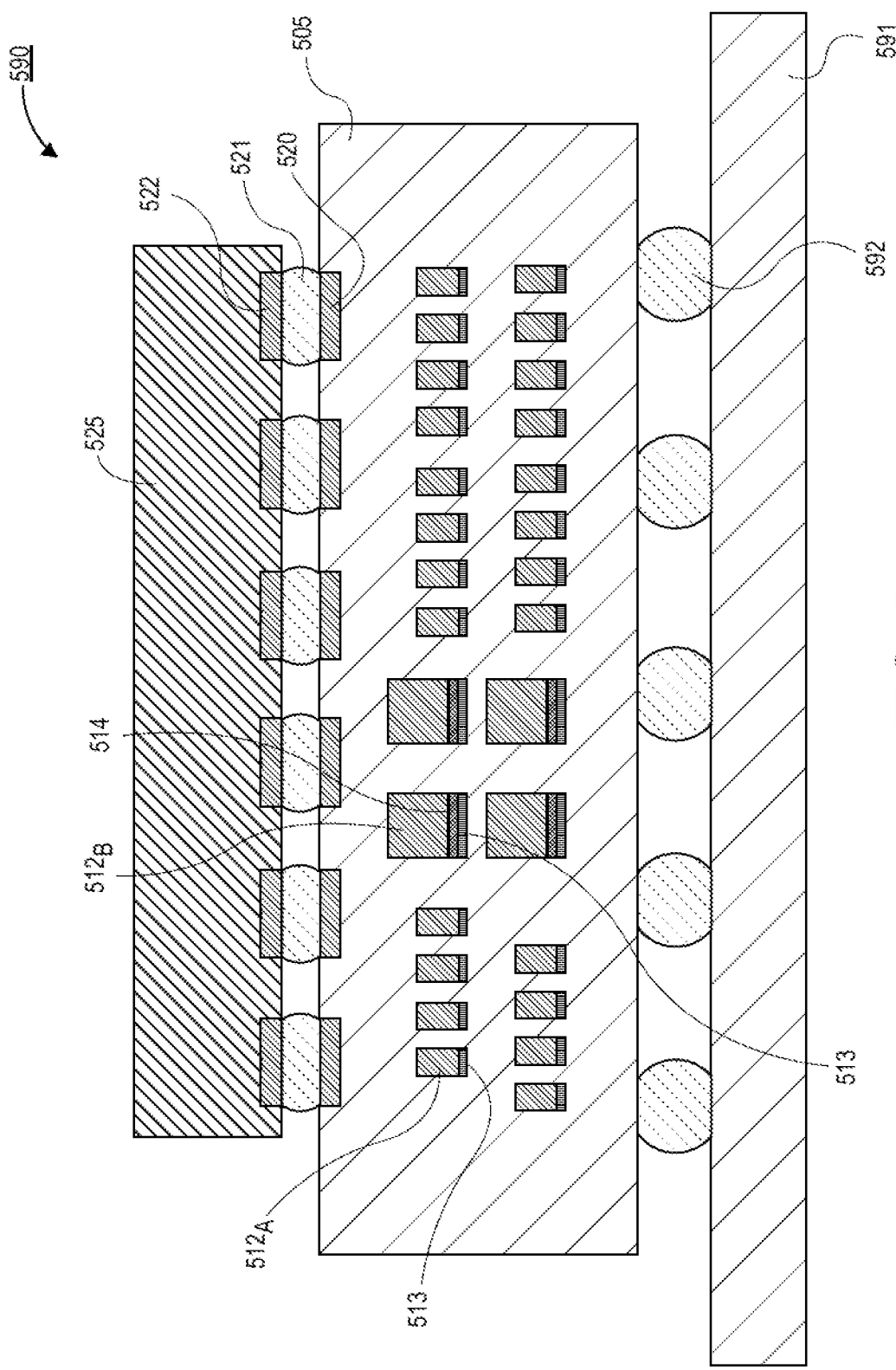
FIG. 5 is a cross-sectional illustration of an electronic system with a package substrate with traces with non-uniform thicknesses, in accordance with an embodiment.

Referring now to FIG. 5, a cross-sectional illustration of an electronic system 590 is shown, in accordance with an embodiment. In an embodiment, the electronic system 590 may comprise a board 591, such as a printed circuit board (PCB). In an embodiment, the board 591 is coupled to a package substrate 505 by second level interconnects (SLIs) 592. In an embodiment, the package substrate 505 may comprise a plurality of dielectric layers that are laminated over each other. In an embodiment, the package substrate 505 may comprise a core. In an embodiment, a plurality of metallization layers may be provided in the package substrate 505. In the illustrated embodiment, two metallization layers are shown for simplicity. But it is to be appreciated that a metallization layer may be provided on each laminated layer of the package substrate 505.

In an embodiment, each metallization layer may include first traces $512_A$ and second traces $512_B$. The first traces $512_A$ may have a thickness that is smaller than a thickness of the second traces $512_B$. In an embodiment, the first traces $512_A$ may be provided over a first seed layer 513, and the second traces $512_B$ may be provided over the first seed layer 513 and a second seed layer 514. The second seed layer 514 may have a resistivity that is lower than the resistivity of the first seed layer 513. For example, the first seed layer 513 may comprise titanium, and the second seed layer 514 may comprise copper. In an embodiment, the first traces $512_A$ may be signaling traces, and the second traces $512_B$ may be power delivery traces.

In an embodiment, the package substrate 505 may be coupled to a die 525. For example, pads 520 on the package substrate 505 may be coupled to die pads 522 by a solder 521. However, it is to be appreciated that any first level interconnect (FLI) architecture may be used to couple the package substrate 505 to the die 525. In an embodiment, the die 525 may be any type of active semiconductor die. For example, the die 525 may be a processor, a graphics processor, a communications IC, a SoC, a memory die, or any other type of die.

In FIGS. 2A-5, embodiments included non-uniform metallization layers. However, it is to be appreciated that metal features with non-uniform thicknesses are not limited to the metallization layers within the package substrate. In additional embodiments, the first level interconnect (FLI) pads may also include non-uniform thicknesses. Non-uniform thickness FLI pads can be used for several advantages. For example, core FLI pads may need to have a different thickness than bridge FLI pads. Additionally, a first die may need FLI pads at a first thickness, and a second die may need FLI pads at a second thickness that is different than the first thickness. Furthermore, embodiments may utilize different thickness FLI pads in order to equalize the bump height between pads with different solder resist openings.

Figure 6A:
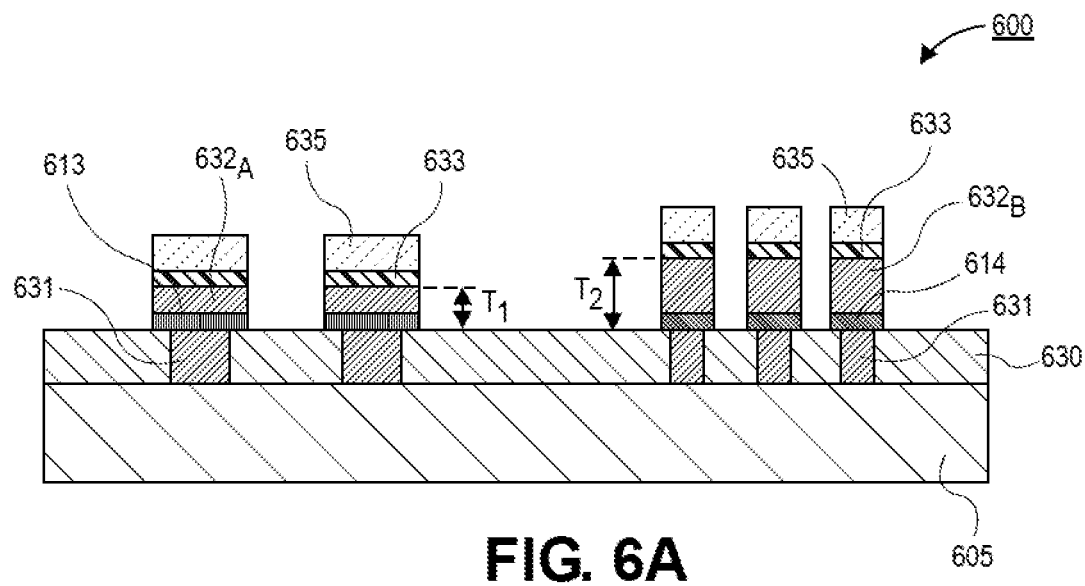
FIG. 6A is a cross-sectional illustration of a package substrate with first level interconnects (FLIs) with non-uniform pad thicknesses, in accordance with an embodiment.

Referring now to FIG. 6A, a cross-sectional illustration of an electronic package 600 is shown, in accordance with an embodiment. In an embodiment, the electronic package 600 comprises a package substrate 605. The package substrate 605 may include a plurality of laminated dielectric layers. Conductive routing (not shown) may also be provided through the package substrate 605. The conductive routing may be coupled to vias 631 that pass through a solder resist layer 630.

In an embodiment, FLI pads $632_A$ and $632_B$ are provided over the solder resist layer 630. In an embodiment, first FLI pads $632_A$ may have a first thickness $T_1$, and second FLI pads $632_B$ may have a second thickness $T_2$ that is greater than the first thickness $T_1$. In a particular embodiment, the second thickness $T_2$ is at least twice as large as the first thickness $T_1$. The first FLI pads $632_A$ may be core FLI pads that are configured to be attached to the core pads of a die, and the second FLI pads $632_B$ may be bridge FLI pads that are configured to couple a die to an embedded bridge. In an embodiment, a surface finish 633 and a solder 635 may be disposed over the FLI pads 632.

In an embodiment, the first FLI pads $632_A$ may be formed over a first seed layer 613, and the second FLI pads $632_A$ may be formed over a second seed layer 614. The first seed layer 613 may have a resistivity that is greater than a resistivity of the second seed layer 614. For example, the first seed layer 613 may comprise titanium, and the second seed layer 614 may comprise copper. In an embodiment, the first seed layer 613 may be isolated over the first FLI pads $632_A$ using a sputtering deposition process with a mask that blocks the first seed layer 613 from being deposited in the location of the second FLI pads $632_B$. That is, a line of sight deposition process may be used to selectively deposit the first seed layer 613 over portions of the electronic package 600 that require thinner FLI bumps 632. Similar to embodiments described above, the higher resistivity of the first seed layer 613 results in less plating compared to the lower resistivity second seed layer 614.

Figure 6B:
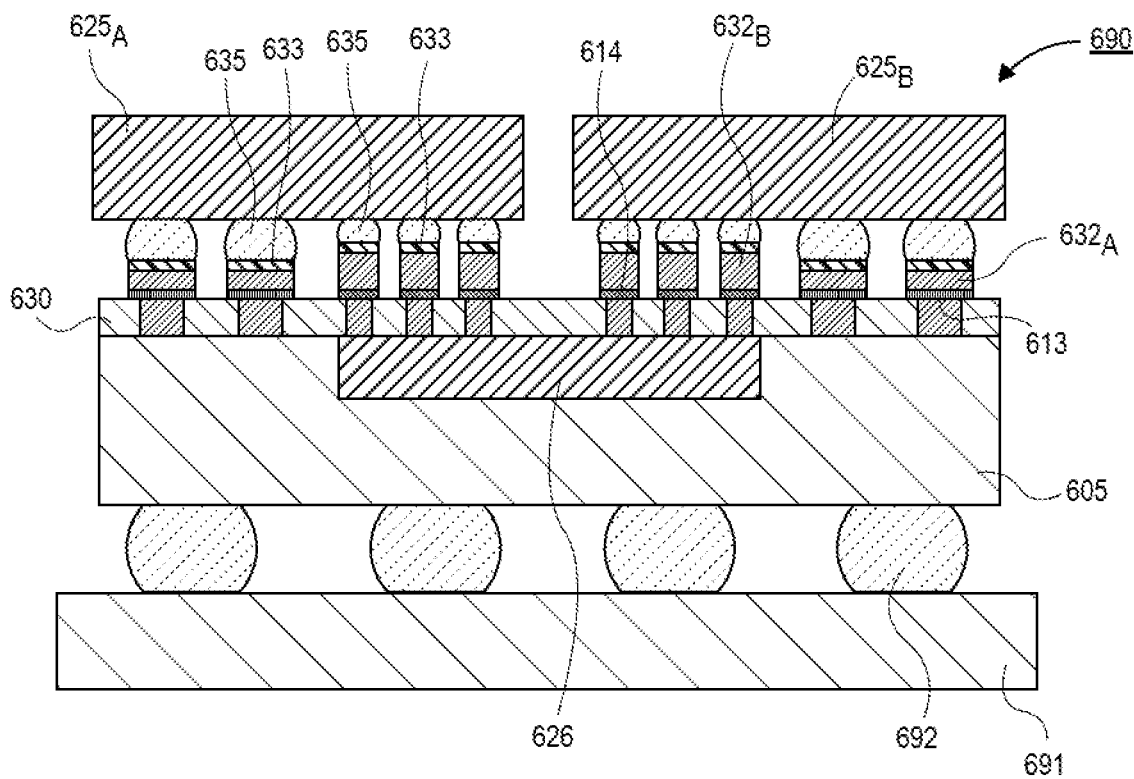
FIG. 6B is a cross-sectional illustration of an electronic system with first FLIs with a first thickness and second FLIs with a second thickness, in accordance with an embodiment.

Referring now to FIG. 6B, a cross-sectional illustration of an electronic system 690 is shown, in accordance with an embodiment. In an embodiment, the electronic system 690 comprises a board 691, such as a PCB. A package substrate 605 is coupled to the board 691 by SLIs 692, such as solder balls or the like. In an embodiment, a bridge die 626 is embedded in the package substrate 605. The bridge die 626 communicatively couples a first die $625_A$ to a second die $625_B$.

In an embodiment, the dies 625 may be coupled to the package substrate 605 through solder 635, a surface finish 633, and FLI pads $632_A$. The dies 625 may be coupled to the bridge die 626 through solder 635, a surface finish 633, and FLI pads $632_B$. As shown, the FLI pads $632_B$ are thicker than the FLI pads $632_A$. The thicker FLI pads $632_B$ may be used since the pitch of the FLI pads $632_B$ is smaller, and results in a smaller amount of solder 635 being disposed over the FLI pads $632_B$ compared to the amount of solder 635 disposed over the FLI pads $632_A$.

Figure 6C:
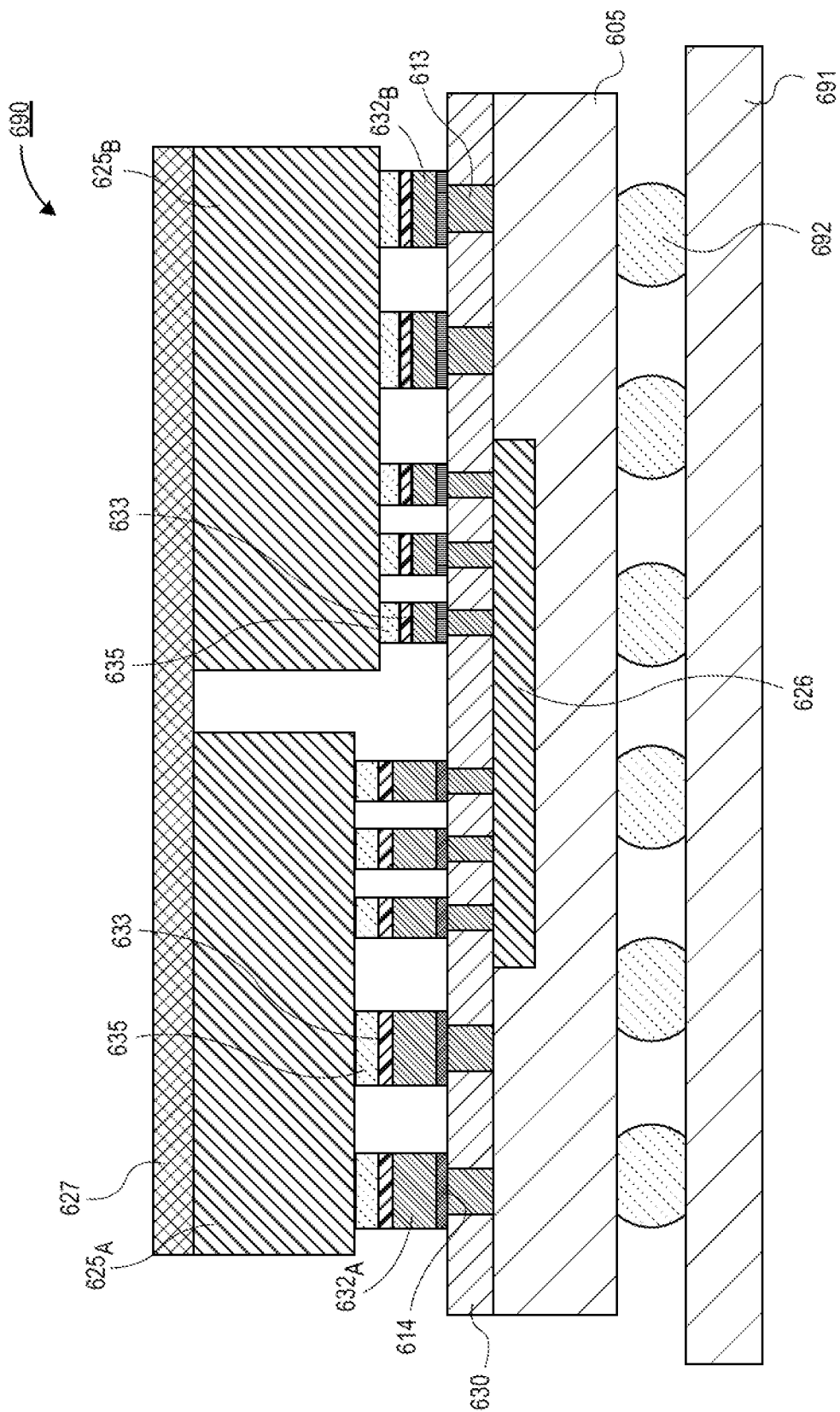
FIG. 6C is a cross-sectional illustration of an electronic system with first FLIs for a first die and second FLIs for a second die, in accordance with an embodiment.

Referring now to FIG. 6C, a cross-sectional illustration of an electronic system 690 is shown, in accordance with an additional embodiment. In an embodiment, the electronic system 690 comprises a board 691 and a package substrate 605 coupled to the board 691 by SLIs 692. In an embodiment, a bridge die 626 is embedded in the package substrate 605. In an embodiment, the bridge die 626 couples together a first die $625_A$ to a second die $625_B$. In an embodiment, the thicknesses of the first die $625_A$ and the second die $625_B$ may be different than each other. For example, the first die $625_A$ is thinner than the second die $625_B$. In order to allow for the backside surfaces of the first die $625_A$ and the second die $625_B$ to be substantially coplanar with each other, the FLI pads 632 may have different thicknesses. For example, the FLI pads $632_A$ under the first die $625_A$ may be thicker than the FLI pads $632_B$ under the second die $625_B$. The FLI pads $632_A$ may be over a seed layer 614, and the FLI pads $632_B$ may be over a seed layer 613. The seed layer 614 may have a lower resistivity than a resistivity of the seed layer 613. For example, the seed layer 614 may comprise copper, and the seed layer 613 may comprise titanium.

Due to the planarity of the backside surfaces of the dies $625_A$ and $625_B$, a thermal solution 627 may be easily assembled to the electronic system 690. For example, the thermal solution 627 may be an integrated heat spreader. In an embodiment, the backside surfaces of the dies $625_A$ and $625_B$ may be coupled to the thermal solution 627 by a thermal interface material (TIM).

Figure 7A:
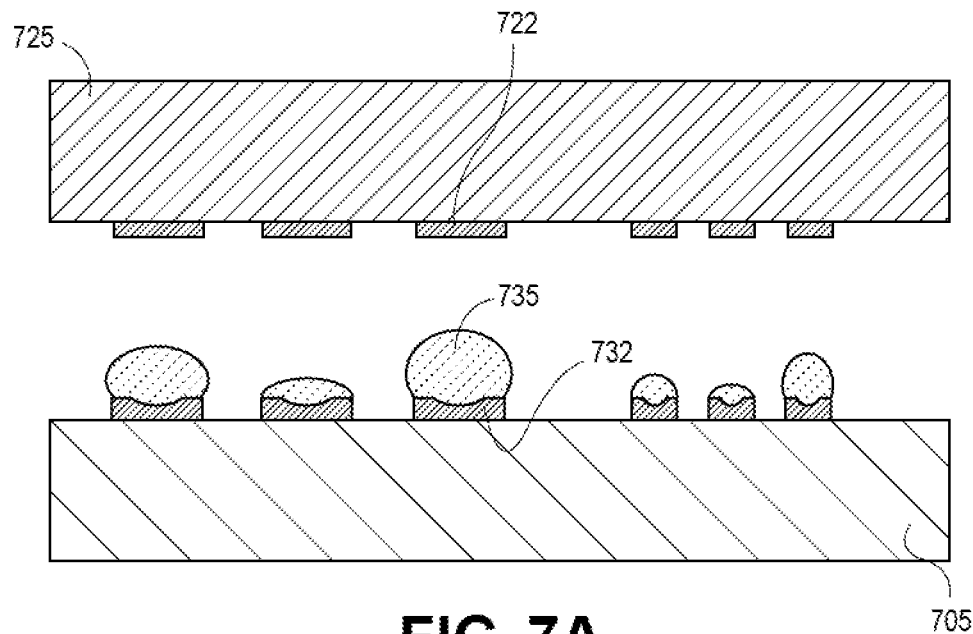
FIG. 7A is a cross-sectional illustration of a package substrate with non-uniform solder thicknesses.

Additional embodiments address issues with non-uniform bump heights. The average bump thickness variation (rBTV) is a critical metric that needs to be minimized in order to have successful thermocompression bonding (TCB) to attach the die to the package substrate. An example of poor rBTV is shown in FIG. 7A. As shown, pads 732 over a package substrate 705 have solder 735 with varying volumes and thicknesses. As such, when the pads 722 of die 725 are brought into contact with the solder 735, there may be solder bridging between pads due to excess solder 735 and/or non-contact opens due to not enough solder 735.

Figure 7B:
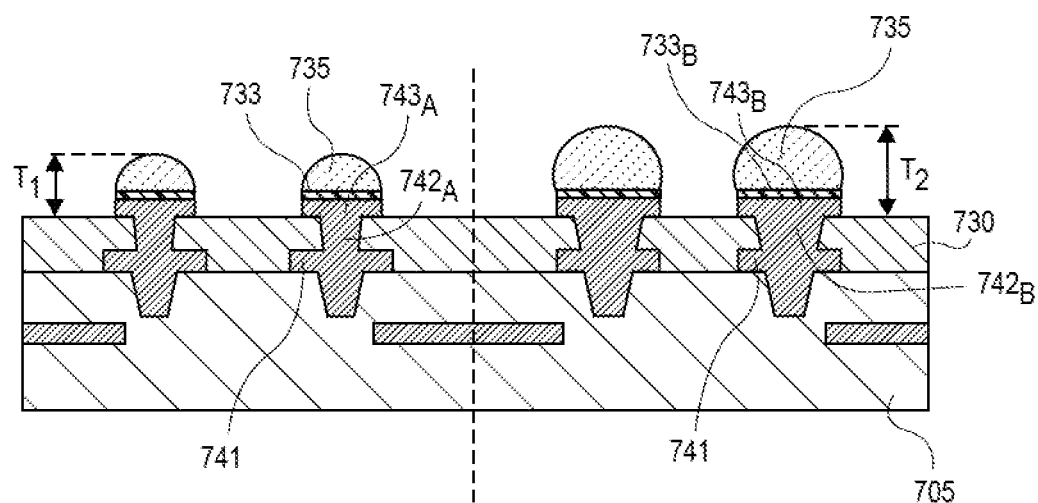
FIG. 7B is a cross-sectional illustration of a package substrate with FLIs with non-uniform bump heights.

In some instances, the difference in solder resist opening width may also result in bump thickness variation. An example of such a situation is shown in FIG. 7B. As shown, first pads 741 on a package substrate 705 are coupled to FLI pads $743_A$ and $743_B$ by vias $742_A$ and $742_B$ through the solder resist 730. FLI pads $743_A$ may have a diameter that is smaller than the FLI pads $743_B$, Surface finishes 733 are over the FLI pads $743_A$ and $743_B$ and solder 735 is over the surface finishes 733. Due to the variation in FLI pad 743 diameter, the solders 735 may have bump thickness variation. That is, over the FLI pad $743_A$, the solder has a first thickness $T_1$, and over the FLI pad $743_B$ the solder has a second thickness $T_2$ that is greater than the first thickness $T_1$.

Figure 8:
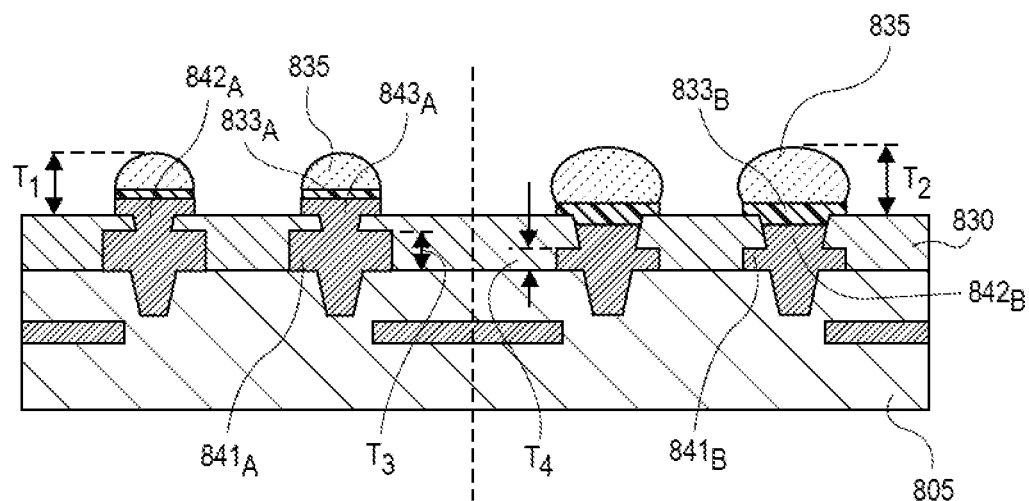
FIG. 8 is a cross-sectional illustration of a package substrate with FLIs with non-uniform solder resist openings and uniform bump heights, in accordance with an embodiment.

Accordingly, embodiments disclosed herein include pads with non-uniform pad thicknesses in order to account for solder volume differences. An example of one such embodiment is shown in FIG. 8. In an embodiment, the solder 835 thicknesses are substantially equal despite differences in solder 835 volume. For example, the solder 835 over pad $842_A$ has a first thickness $T_1$, and the solder 835 over pad $842_B$ has a second thickness $T_2$, that is substantially equal to the first thickness $T_1$. The uniformity in the solder bump thicknesses is driven by the non-uniform thickness of underlying pads $841_A$ and $841_B$. As shown, the pads $841_A$ and $841_B$ over the package substrate 805 have non-uniform thicknesses. That is, pad $841_A$ has a third thickness $T_3$, and pad $841_B$ has a fourth thickness $T_4$ that is smaller than the third thickness $T_3$. FLI pad $843_A$ may be coupled to the pad $841_A$ by a via $842_A$. A surface finish $833_A$ is over the pad $841_A$, and the solder 835 is over the surface finish $833_A$. On the other pad $841_B$, a via $842_B$ is provided. However, the via $842_B$ may not pass through the entire thickness of the solder resist 830. A portion of the surface finish $833_B$ fills the remainder of the opening through the solder resist and forms a pad over the solder resist 830. That is, the surface finish $833_B$ may include a first sidewall that is tapered (i.e., within the solder resist 830), and a sidewall that is vertical (i.e., above the solder resist 830). The solder 835 is then plated directly on the surface finish $833_B$.

Referring now to FIGS. 9A-9I, a series of cross-sectional illustrations depicting a process for forming an electronic package similar to the electronic package shown in FIG. 8 is shown, in accordance with an embodiment.

Figure 9A:
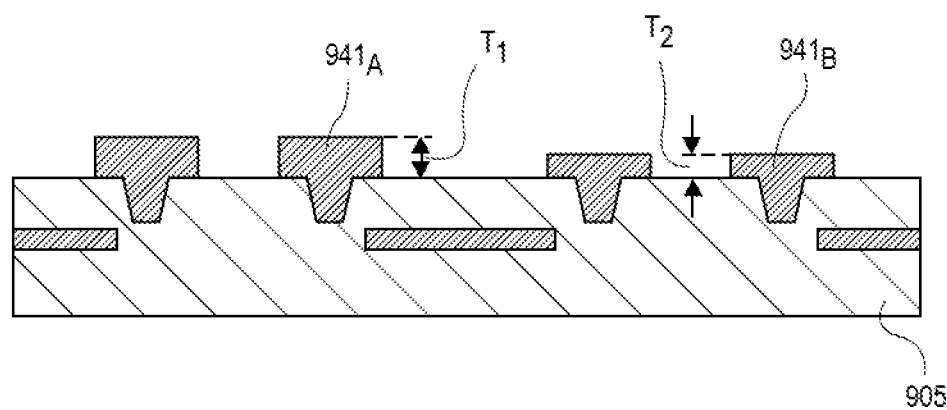
FIG. 9A-9I are cross-sectional illustrations depicting a process for forming an electronic package with non-uniform solder resist openings with uniform bump heights, in accordance with an embodiment.

Referring now to FIG. 9A, a cross-sectional illustration of a package substrate 905 is shown, in accordance with an embodiment. In an embodiment, pads $941_A$ and $941_B$ may be provided over the package substrate 905. In an embodiment, pads $941_A$ may have a first thickness $T_1$, and pads $941_B$ may have a second thickness $T_2$. The second thickness $T_2$ may be smaller than the first thickness $T_1$. In an embodiment, the pads 941 with variable thicknesses may be formed using any of the manufacturing processes described in greater detail above. For example, the pad $941_A$ may be formed over a seed layer that has a lower resistivity than a seed layer formed below the pad $941_B$.

Figure 9B:
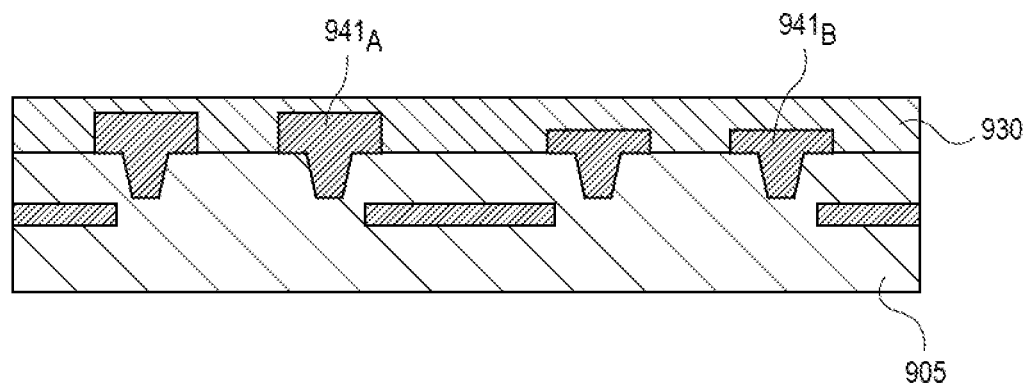

Referring now to FIG. 9B, a cross-sectional illustration of the package substrate 905 after a solder resist 930 is disposed over the pads $941_A$ and $941_B$. In an embodiment, the solder resist may be disposed with a lamination process.

Figure 9C:
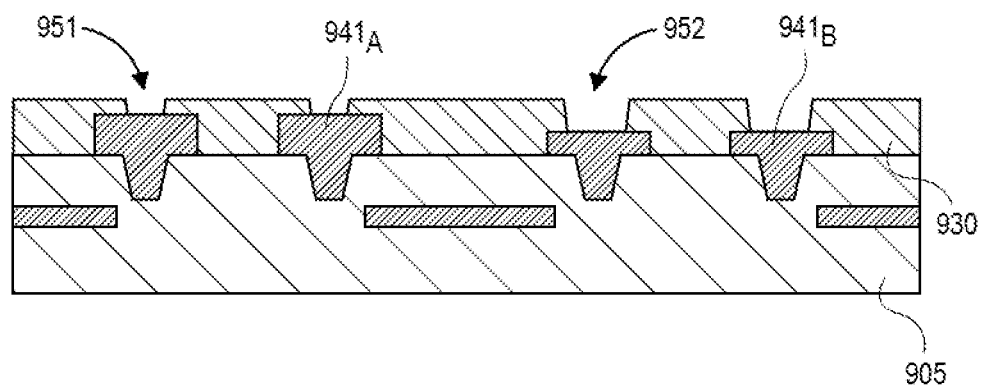

Referring now to FIG. 9C, a cross-sectional illustration of the package substrate 905 after openings are formed through the solder resist 930. First openings 951 may be formed over the pads $941_A$ and second openings 952 may be formed over the pads $941_B$. In an embodiment, a maximum width of the second openings 952 may be wider than a maximum width of the first openings 951. Due to the differences in the widths of the solder resist openings, differing amounts of solder will be plated in a subsequent processing operation. However, the difference in the thicknesses of the pads $941_A$ and $941_B$ is used to account for the non-uniform solder volumes.

Figure 9D:
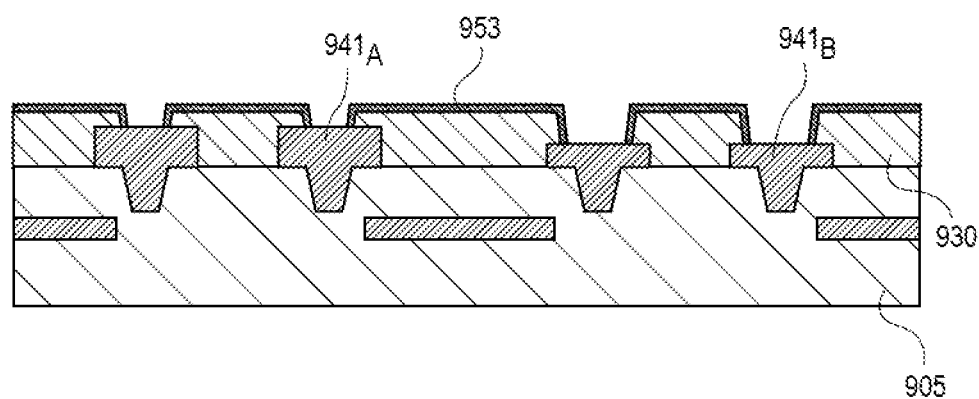

Referring now to FIG. 9D, a cross-sectional illustration of the package substrate 905 after a seed layer 953 is deposited is shown, in accordance with an embodiment. In an embodiment, the seed layer 953 may comprise copper or the like. In an embodiment, the seed layer 953 may be deposited with a sputtering process, or any other suitable deposition process.

Figure 9E:
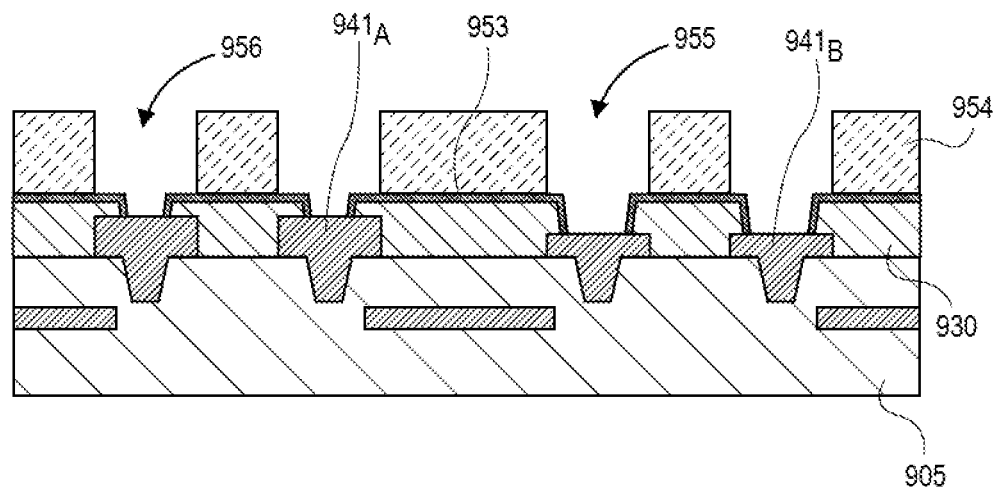

Referring now to FIG. 9E, a cross-sectional illustration of the package substrate 905 after a resist layer 954 is disposed over the seed layer 953 is shown, in accordance with an embodiment. In an embodiment, the resist layer 954 is patterned with any suitable patterning process to form openings 956 and 955. Openings 956 may be provided over pads $941_A$, and openings 955 may be provided over pads $941_B$.

Figure 9F:
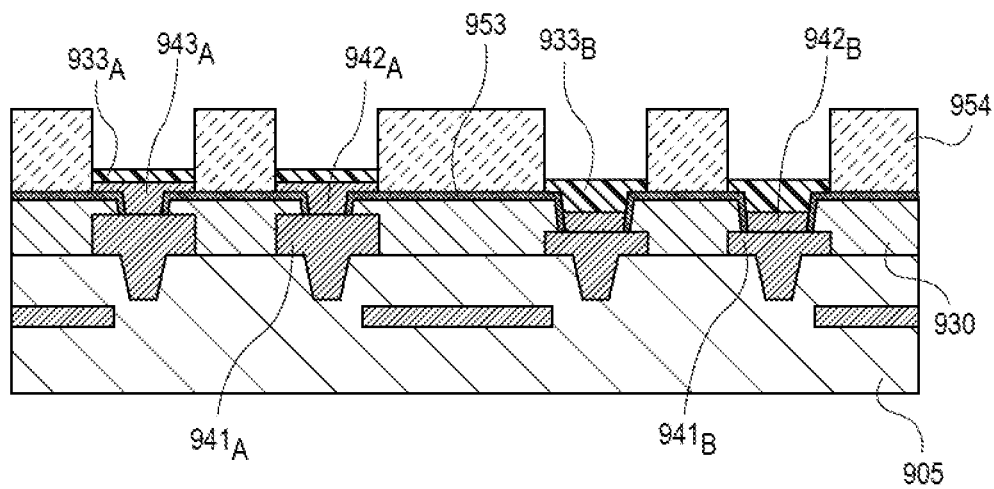

Referring now to FIG. 9F, a cross-sectional illustration of the package substrate 905 after a plating process is used to fill the openings is shown, in accordance with an embodiment. First, a copper material is plated. The copper forms vias $942_A$ and pads $943_A$ over the pads $941_A$. A surface finish $933_A$ is formed over the pads $943_A$. The copper forms via $942_B$ over the pad $941_B$. Since the pad $941_B$ is thinner than the pad $941_A$, the via $942_B$ may not fill the entire opening through the solder resist 930. As such, the surface finish $933_B$ may fill a portion of the solder resist opening and form the pad over the solder resist layer 930.

Figure 9G:
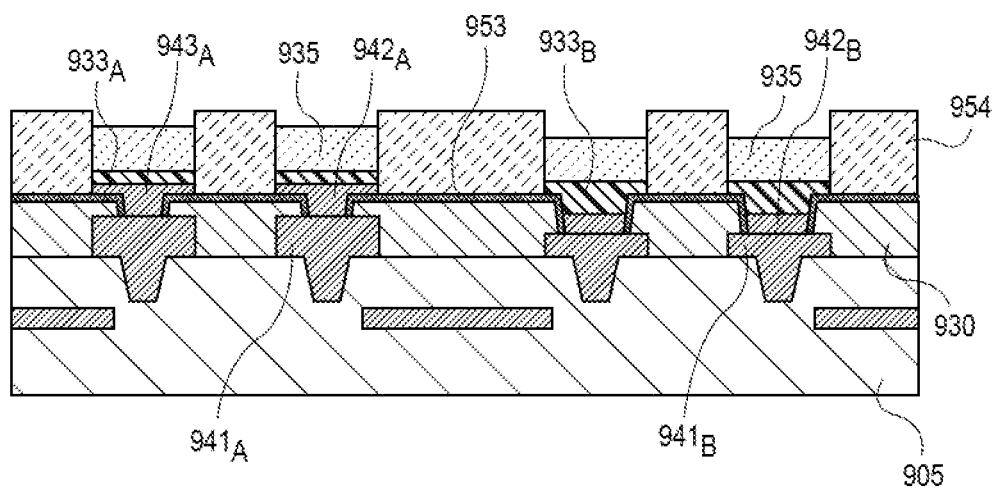

Referring now to FIG. 9G, a cross-sectional illustration of the package substrate 905 after solder 935 is plated over the surface finishes is shown, in accordance with an embodiment. In an embodiment, the solder 935 may be plated with any suitable deposition process. In an embodiment, a volume of solder 935 over the surface finish $933_B$ may be greater than a volume of solder 935 over the surface finish $933_A$.

Figure 9H:
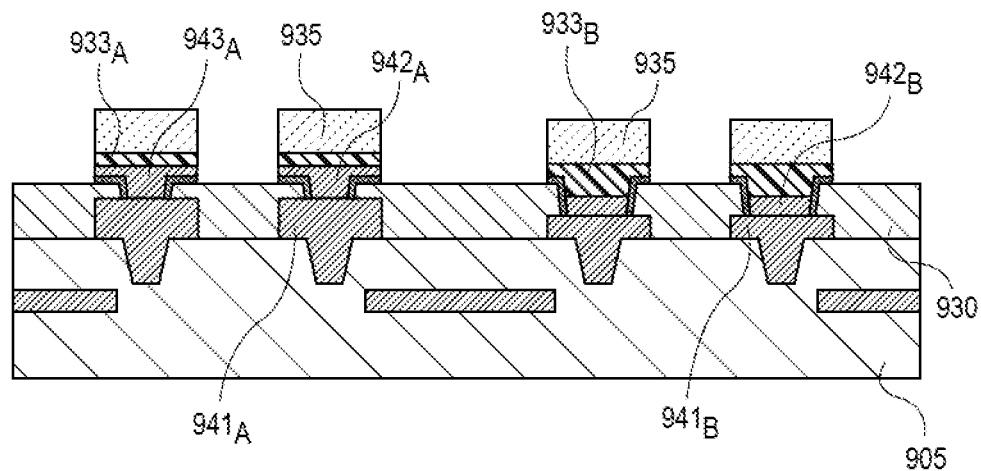

Referring now to FIG. 9H, a cross-sectional illustration of the package substrate 905 after the resist 954 is stripped and the seed layer 953 is etched is shown, in accordance with an embodiment. In an embodiment, the resist 954 may be stripped with any suitable process, such as an ashing process. In an embodiment, the seed layer 953 is etched with a flash etch or the like.

Figure 9I:
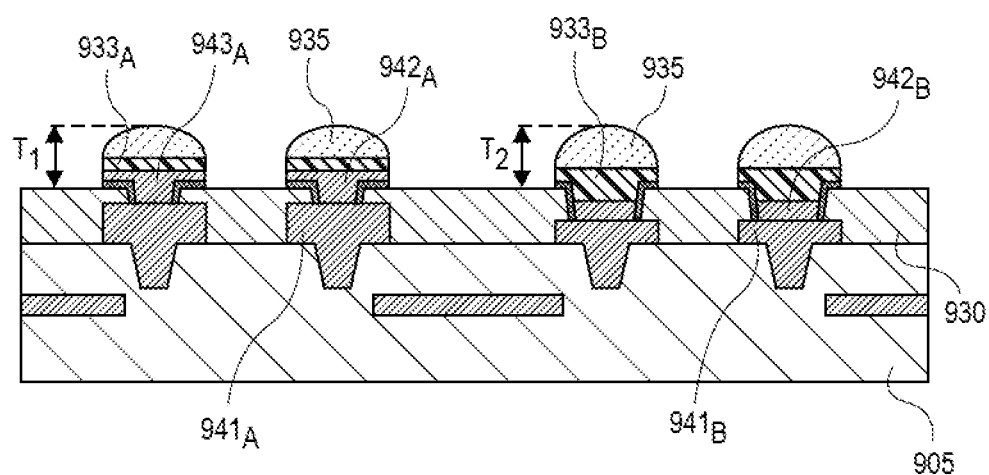

Referring now to FIG. 9I, a cross-sectional illustration of the package substrate 905 after a solder 935 reflow is shown, in accordance with an embodiment. As shown, after the reflow, the solder 935 over surface finish $933_A$ has a first thickness $T_1$, and the solder 935 over surface finish $933_B$ has a second thickness $T_2$ that is substantially equal to the first thickness $T_1$, despite having a different solder volume and a different underlying pad width. Accordingly, bump thickness variation can be significantly reduced.

Figure 10:
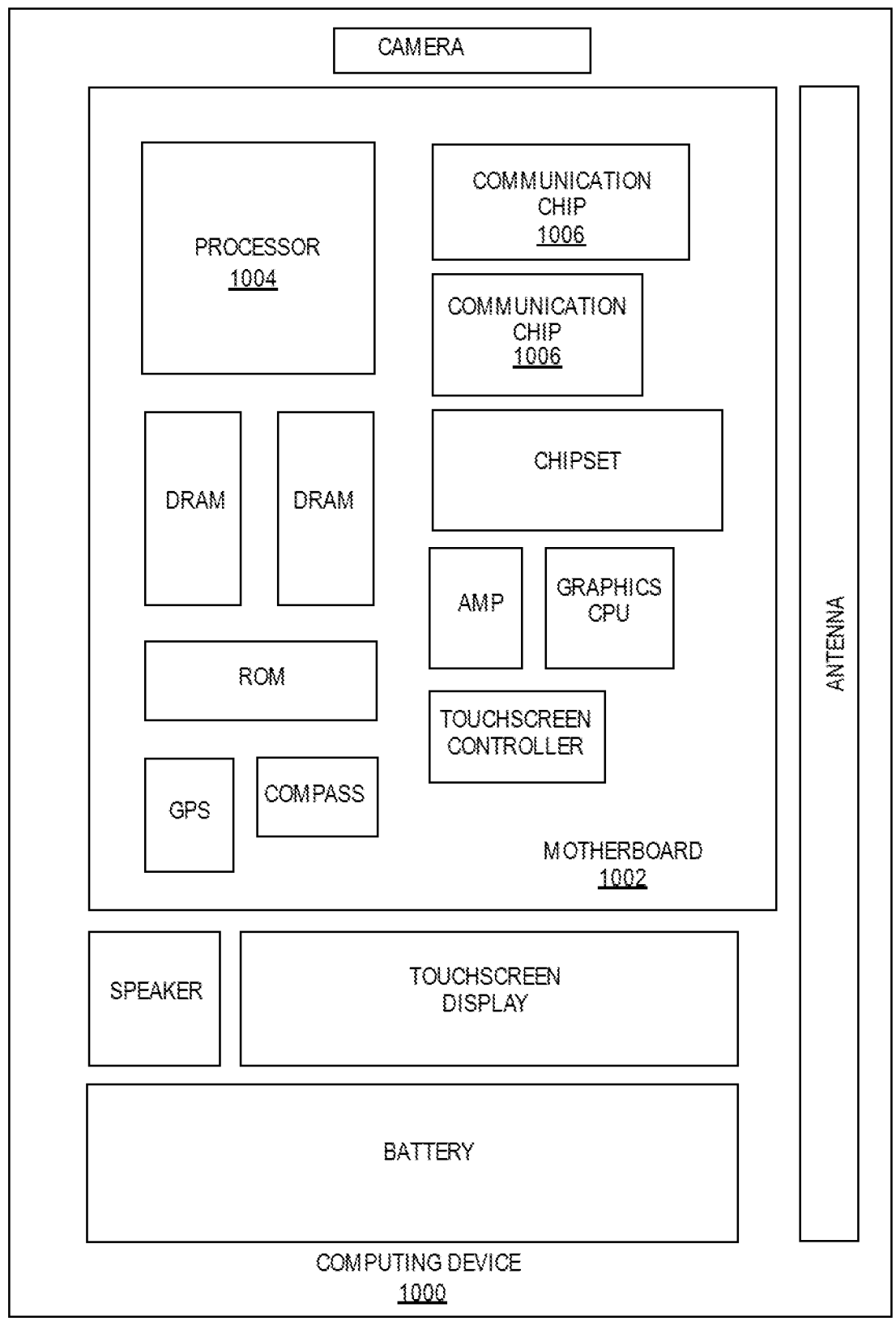
FIG. 10 is a schematic of a computing device built in accordance with an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be part of an electronic package that comprises a metallization layer with variable trace thicknesses, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be part of an electronic package that comprises a metallization layer with variable trace thicknesses, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a plurality of stacked layers; a first trace on a first layer, wherein the first trace has a first thickness; a second trace on the first layer, wherein the second trace has a second thickness that is greater than the first thickness; and a second layer over the first trace and the second trace.

Example 2: the electronic package of Example 1, wherein a first seed layer is under the first trace, and a second seed layer is under the second trace, wherein the first seed layer is different than the second seed layer.

Example 3: the electronic package of Example 2, wherein the first seed layer and the second seed layer comprise different ones of copper, titanium, ruthenium, nickel, gold, iron, and tin.

Example 4: the electronic package of Example 3, wherein the second seed layer comprises copper and titanium under the copper.

Example 5: the electronic package of Examples 2-4, wherein the first seed layer has a first resistance, and wherein the second seed layer has a second resistance, wherein the second resistance is lower than the first resistance.

Example 6: the electronic package of Examples 1-5, wherein the second thickness is at least double the first thickness.

Example 7: the electronic package of Examples 1-6, wherein the first trace is a signaling trace, and wherein the second trace is a power delivery trace.

Example 8: the electronic package of Examples 1-7, wherein a cross-section of the first trace is rectangular, and wherein a cross-section of the second trace is rectangular.

Example 9: the electronic package of Examples 1-8, wherein the first trace has a first width, and the second trace has a second width, wherein the second width is greater than the first width.

Example 10: the electronic package of Examples 1-9, further comprising: a third trace spaced apart from the first trace by a first pitch; and a fourth trace spaced apart from the second trace by a second pitch, wherein the second pitch is greater than the first pitch.

Example 11: an electronic package, comprising: a first layer, wherein the first layer comprises a dielectric material; a first seed layer over the first layer, wherein the first seed layer has a first resistivity; a second seed layer over the first layer, wherein the second seed layer has a second resistivity, wherein the second resistivity is less than the first resistivity; a first trace over the first seed layer; a second trace of the second seed layer; and a second layer over the first trace and the second trace, wherein the second layer comprises the dielectric material.

Example 12: the electronic package of Example 11, wherein the first trace has a first thickness, and wherein the second trace has a second thickness that is greater than the first thickness.

Example 13: the electronic package of Example 12, wherein the second thickness is at least double the first thickness.

Example 14: the electronic package of Examples 11-13, wherein the first seed layer comprises titanium and the second seed layer comprises copper.

Example 15: the electronic package of Example 14, wherein the second seed layer further comprises titanium under the copper.

Example 16: the electronic package of Examples 11-15, further comprising: a third seed layer on the first layer, wherein the third seed layer has a third resistance that is between the first resistance and the second resistance.

Example 17: the electronic package of Example 16, further comprising: a third trace over the third seed layer, wherein a thickness of the third trace is between a thickness of the first trace and a thickness of the second trace.

Example 18: a method of forming a metal layer in an electronic package, comprising: forming a seed layer over a dielectric layer, wherein the seed layer comprises: a first layer with a first resistivity; and a second layer over the first layer with a second resistivity, wherein the second resistivity is lower than the first resistivity; disposing a resist over the seed layer; forming a first opening through the resist; removing the second layer from within the first opening so that the first layer is exposed; forming a second opening through the resist, wherein the second layer is exposed; plating a first trace over the first layer in the first opening; and plating a second trace over the second layer in the second opening.

Example 19: the method of Example 18, wherein the second layer is removed from the first opening with a laser used to form the first opening.

Example 20: the method of Example 18, wherein the second layer is removed from the first opening with an etchant, wherein the second opening is covered by a mask during the etching process.

Example 21: the method of Examples 18-20, wherein the first trace has a first thickness, and the second trace has a second thickness, wherein the second thickness is greater than the first thickness.

Example 22: the method of Examples 18-21, wherein the first layer comprises titanium, and wherein the second layer comprises copper.

Example 23: an electronic system, comprising: a board; a package substrate coupled to the board, wherein the package substrate comprises: a plurality of stacked layers; a first trace on a first dielectric layer, wherein the first trace has a first thickness; a second trace on the first dielectric layer, wherein the second trace has a second thickness that is greater than the first thickness; and a second dielectric layer over the first trace and the second trace; and a die coupled to the package substrate.

Example 24: the electronic system of Example 23, wherein a first seed layer is under the first trace, and a second seed layer is under the second trace, wherein the first seed layer is different than the second seed layer.

Example 25: the electronic system of Example 24, wherein the first seed layer comprises titanium, and wherein the second seed layer comprises copper.

Example 26: an electronic package, comprising: a first layer, wherein the first layer comprises a dielectric material; a second layer over the first layer, wherein the second layer is a solder resist; a first pad on the second layer, wherein the first pad has a first thickness; and a second pad on the second layer, wherein the second pad has a second thickness that is greater than the first thickness.

Example 27: the electronic package of Example 26, further comprising: a first via through the second layer, wherein the first via is coupled to the first pad; and a second via through the second layer, wherein the second via is coupled to the second pad.

Example 28: the electronic package of Example 26 or Example 27, further comprising: a seed layer under the first pad.

Example 29: the electronic package of Example 28, wherein the seed layer comprises a material with a resistivity higher than a resistivity of copper.

Example 30: the electronic package of Example 29, wherein the seed layer comprises titanium.

Example 31: the electronic package of Examples 26-30, wherein the first pad is a core pad, and wherein the second pad is a bridge pad.

Example 32: the electronic package of Example 31, wherein the second pad is electrically coupled to a bridge below the first layer.

Example 33: the electronic package of Examples 26-32, further comprising: a surface finish over the first pad and the second pad.

Example 34: the electronic package of Example 33, wherein the surface finish comprises nickel.

Example 35: the electronic package of Example 33 or Example 34, further comprising: a solder over the surface finish, wherein the solder comprises tin.

Example 36: an electronic package, comprising: a package substrate; a first set of pads over the package substrate, wherein individual ones of the first set of pads have a first thickness; and a second set of pads over the package substrate, wherein individual ones of the second set of pads have a second thickness that is greater than the first thickness.

Example 37: the electronic package of Example 36, further comprising: a seed layer under the first set of pads, wherein the seed layer comprises a material with a resistivity that is greater than copper.

Example 38: the electronic package of Example 37, wherein the seed layer comprises titanium.

Example 39: the electronic package of Examples 36-38, further comprising: a first die coupled to the first set of pads; and a second die coupled to the second set of pads.

Example 40: the electronic package of Example 39, wherein the first die has a third thickness, and wherein the second die has a fourth thickness, wherein the third thickness is greater than the fourth thickness.

Example 41: the electronic package of Example 40, wherein a backside surface of the first die is substantially coplanar with a backside surface of the second die.

Example 42: the electronic package of Example 41, further comprising an integrated heat spreader over the first die and the second die.

Example 43: the electronic package of Examples 39-42, wherein the first die is communicatively coupled to the second die by a bridge embedded in the package substrate.

Example 44: the electronic package of Examples 36-43, further comprising: a solder resist between the first set of pads and the package substrate.

Example 45: the electronic package of Example 44, further comprising: vias through the solder resist, wherein the vias are below individual ones of the first set of pads.

Example 46: the electronic package of Examples 36-45, wherein the second thickness is at least twice as large as the first thickness.

Example 47: an electronic system, comprising: a board; a package substrate coupled to the board; a first set of pads over the package substrate, wherein individual ones of the first set of pads have a first thickness; and a second set of pads over the package substrate, wherein individual ones of the second set of pads have a second thickness that is greater than the first thickness; a first die coupled to the first set of pads; and a second die coupled to the second set of pads.

Example 48: the electronic system of Example 47, further comprising: a seed layer under the first set of pads, wherein the seed layer comprises a material with a resistivity that is greater than copper.

Example 49: the electronic system of Example 48, wherein the seed layer comprises titanium.

Example 50: the electronic system of Examples 47-49, wherein the second thickness is at least twice as large as the first thickness.

Example 51: an electronic package, comprising: a package substrate; a first pad over the package substrate, wherein the first pad has a first thickness; a second pad over the package substrate, wherein the second pad has a second thickness that is smaller than the first thickness; a solder resist over the first pad and the second pad; a first via through the solder resist over the first pad; a third pad over the first via; a first surface finish over the third pad; a second via partially through the solder resist over the second pad; and a second surface finish over the second via, wherein the second surface finish extends above a top surface of the solder resist.

Example 52: the electronic package of Example 51, wherein the first surface finish and the second surface finish comprise nickel.

Example 53: the electronic package of Example 51 or Example 52, further comprising: a first solder over the first surface finish; and a second solder over the second surface finish.

Example 54: the electronic package of Example 53, wherein a thickness between a top of the solder resist and a top of the first solder is substantially equal to a thickness between the top of the solder resist and a top of the second solder.

Example 55: the electronic package of Example 54, wherein the first solder and the second solder are reflown.

Example 56: the electronic package of Examples 51-55, wherein a maximum width of the first via is narrower than a maximum width of the second via.

Example 57: the electronic package of Examples 51-56, wherein the first thickness is at least twice as large as the second thickness.

Example 58: the electronic package of Examples 51-57, wherein a first sidewall of the second surface finish is tapered.

Example 59: the electronic package of Example 58, wherein a second sidewall of the second surface finish is substantially vertical.

Example 60: the electronic package of Examples 51-59, wherein a width of the third pad is smaller than a maximum width of the second surface finish.

Example 61: a method of forming an electronic package, comprising: forming a solder resist over a first pad with a first thickness and a second pad with a second thickness, wherein the first thickness is greater than the second thickness; forming a first opening over the first pad and a second opening over the second pad; disposing a seed layer over the solder resist; disposing a resist over the seed layer, wherein a third opening is formed into the resist over the first opening, and a fourth opening is formed into the resist over the second opening; plating a metal over the first pad and the second pad, wherein the metal completely fills the first opening and partially fills the second opening; and plating a solder over the metal.

Example 62: the method of Example 61, further comprising: plating a surface finish over the metal before plating the solder.

Example 63: the method of Example 62, wherein the surface finish comprises nickel.

Example 64: the method of Example 62 or Example 63, wherein the surface finish fills a remainder of the second opening.

Example 65: the method of Example 64, wherein the surface finish over the second pad comprises a tapered sidewall surface and a vertical sidewall surface.

Example 66: the method of Examples 61-65, further comprising: reflowing the solder.

Example 67: the method of Example 66, wherein a first distance between the solder resist and a top of the solder over the first pad is substantially equal to a second distance between the solder resist and a top of the solder over the second pad.

Example 68: the method of Examples 61-67, wherein the first thickness is at least twice as large as the second thickness.

Example 69: the method of Examples 61-68, wherein the third opening is wider than the first opening, and wherein the fourth opening is wider than the second opening.

Example 70: the method of Examples 61-69, further comprising: removing the resist; and etching the seed layer.

Example 71: the method of Examples 61-70, wherein the seed layer is deposited with a sputtering process using a shadow mask to selectively deposit the seed layer.

Example 72: an electronic system, comprising: a board; a package substrate coupled to the board; a first pad over the package substrate, wherein the first pad has a first thickness; a second pad over the package substrate, wherein the second pad has a second thickness that is smaller than the first thickness; a solder resist over the first pad and the second pad; a first via through the solder resist over the first pad; a third pad over the first via; a first surface finish over the third pad; a second via partially through the solder resist over the second pad; and a second surface finish over the second via, wherein the second surface finish extends above a top surface of the solder resist; and a die coupled to the first surface finish and the second surface finish.

Example 73: the electronic system of Example 72, wherein the second surface finish comprises: a tapered first sidewall; and a vertical second sidewall.

Example 74: the electronic system of Example 72 or Example 73, wherein the first surface finish and the second surface finish comprise nickel.

Example 75: the electronic system of Examples 72-74, further comprising: a first solder over the first surface finish; and a second solder over the second surface finish.

Example 76: the electronic system of Example 75, wherein a thickness between a top of the solder resist and a top of the first solder is substantially equal to a thickness between the top of the solder resist and a top of the second solder.

Example 77: a method of forming a metal layer in an electronic package, comprising: forming a first seed layer over a dielectric layer, wherein the first seed layer comprises a first resistivity; forming a second seed layer over portions of the first seed layer, wherein the second seed layer comprises a second resistivity, wherein the second resistivity is lower than the first resistivity; disposing a resist over the first seed layer and the second seed layer; forming a first opening through the resist to expose the first seed layer; forming a second opening through the resist to expose the second seed layer; plating a first trace over the first seed layer in the first opening; and plating a second trace over the second seed layer in the second opening.

Example 78: the method of Example 77, wherein the second seed layer is selectively deposited using a sputtering process with a shadow mask.

Example 79: the method of Example 77 or Example 78, wherein the second trace is thicker than the first trace.

What is claimed is:

1. An electronic package, comprising:
   a plurality of stacked layers;
   a first trace on a first layer, wherein the first trace has a first thickness;
   a second trace on the first layer, wherein the second trace has a second thickness that is greater than the first thickness, wherein a first seed layer is under the first trace, and a second seed layer is under the second trace, and wherein the first seed layer is different than the second seed layer; and
   a second layer over the first trace and the second trace, wherein the second layer has a first opening exposing a portion of a top surface of the first trace, and a second opening exposing a portion of a top surface of the second trace.

2. The electronic package of claim 1, wherein the first seed layer and the second seed layer comprise different ones of copper, titanium, ruthenium, nickel, gold, iron, and tin.

3. The electronic package of claim 2, wherein the second seed layer comprises copper and titanium under the copper.

4. The electronic package of claim 1, wherein the first seed layer has a first resistance, and wherein the second seed layer has a second resistance, wherein the second resistance is lower than the first resistance.

5. The electronic package of claim 1, wherein the second thickness is at least double the first thickness.

6. The electronic package of claim 1, wherein the first trace is a signaling trace, and wherein the second trace is a power delivery trace.

7. The electronic package of claim 1, wherein a cross-section of the first trace is rectangular, and wherein a cross-section of the second trace is rectangular.

8. The electronic package of claim 1, wherein the first trace has a first width, and the second trace has a second width, wherein the second width is greater than the first width.

9. The electronic package of claim 1, further comprising:
   a third trace spaced apart from the first trace by a first pitch; and a fourth trace spaced apart from the second trace by a second pitch, wherein the second pitch is greater than the first pitch.

10. An electronic package, comprising:
a first layer, wherein the first layer comprises a dielectric material;
a first seed layer over the first layer, wherein the first seed layer has a first resistivity;
a second seed layer over the first layer, wherein the second seed layer has a second resistivity, wherein the second resistivity is less than the first resistivity;
a first trace over the first seed layer;
a second trace of the second seed layer; and
a second layer over the first trace and the second trace, wherein the second layer comprises the dielectric material.

11. The electronic package of claim 10, wherein the first trace has a first thickness, and wherein the second trace has a second thickness that is greater than the first thickness.

12. The electronic package of claim 11, wherein the second thickness is at least double the first thickness.

13. The electronic package of claim 10, wherein the first seed layer comprises titanium and the second seed layer comprises copper.

14. The electronic package of claim 13, wherein the second seed layer further comprises titanium under the copper.

15. The electronic package of claim 10, further comprising:
a third seed layer on the first layer, wherein the third seed layer has a third resistance that is between the first resistance and the second resistance.

16. The electronic package of claim 15, further comprising:
a third trace over the third seed layer, wherein a thickness of the third trace is between a thickness of the first trace and a thickness of the second trace.

17. An electronic system, comprising:
a board;
a package substrate coupled to the board, wherein the package substrate comprises:
a plurality of stacked layers;
a first trace on a first dielectric layer, wherein the first trace has a first thickness;
a second trace on the first dielectric layer, wherein the second trace has a second thickness that is greater than the first thickness, wherein a first seed layer is under the first trace, and a second seed layer is under the second trace, and wherein the first seed layer is different than the second seed layer; and
a second dielectric layer over the first trace and the second trace, wherein the second layer has a first opening exposing a portion of a top surface of the first trace, and a second opening exposing a portion of a top surface of the second trace; and
a die coupled to the package substrate.

18. The electronic system of claim 17, wherein the first seed layer comprises titanium, and wherein the second seed layer comprises copper.

\* \* \* \* \*